US006259106B1

(12) United States Patent
Boegli et al.

(10) Patent No.: US 6,259,106 B1
(45) Date of Patent: Jul. 10, 2001

(54) APPARATUS AND METHOD FOR CONTROLLING A BEAM SHAPE

(75) Inventors: Volker Boegli, Berkeley; Stephen A. Rishton, Hayward; Lee H. Veneklasen, Castro Valley, all of CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/226,779

(22) Filed: Jan. 6, 1999

(51) Int. Cl.⁷ .................................................. H01J 37/302
(52) U.S. Cl. ....................................................... 250/492.22
(58) Field of Search ...................... 250/492.22, 492.23, 250/492.2

(56) References Cited

U.S. PATENT DOCUMENTS

| | | | |
|---|---|---|---|
| 3,573,849 | 4/1971 | Herriot et al. | 346/103 |
| 3,900,737 | 8/1975 | Collier et al. | 250/492 A |
| 4,213,053 | 7/1980 | Pfeiffer | 250/492 A |
| 4,243,866 | 1/1981 | Pfeiffer et al. | 219/121 EK |
| 4,469,950 | 9/1984 | Taylor et al. | 250/492.2 |
| 4,698,509 | 10/1987 | Wells et al. | 250/492.2 |
| 4,806,921 | 2/1989 | Goodman et al. | 340/747 |
| 4,879,605 | 11/1989 | Warkentin et al. | 358/296 |
| 5,393,987 | 2/1995 | Abboud et al. | 250/492.22 |
| 5,847,959 | * 12/1998 | Veneklasen et al. | 250/492.22 |
| 5,876,902 | 3/1999 | Veneklasen et al. | 430/296 |
| 6,011,269 | * 1/2000 | Veneklasen et al. | 250/492.22 |

FOREIGN PATENT DOCUMENTS

| | | |
|---|---|---|
| 219446 | 7/1982 | (CS) . |
| 221592 | 8/1982 | (CS) . |
| 0166549 A2 | 1/1986 | (EP) . |
| WO 94/28574 | 12/1994 | (WO) . |
| WO 98/33198 | 7/1998 | (WO) . |

OTHER PUBLICATIONS

"On The Throughput Optimization Of Electron Beam Lithography Systems", Elvira Hendrika Mulder, Natuurkundig ingenieur geboren te's–Gravenhage, Jun. 13, 1991, te 14.00 pp. 3–6, 3–7.

"Proximity Correction on The EBLE–150," J. Vac. Sci. Technol. B6(1),, Jan./Feb. 1988 pp. 443–447.

The Reporter of the Institute of Scientific Instrument, "The electron Lithography tool BS 600 and its technology applications."

* cited by examiner

*Primary Examiner*—Kiet T. Nguyen
(74) *Attorney, Agent, or Firm*—Skjerven, Morrill, Macpherson, Franklin & Friel

(57) ABSTRACT

A converter for lithography which generates signals that control a shaping of an electron (or other energy) beam and which includes a translator that translates shape data into shape and position signals, and translates duration information into a duration signal. The converter also includes a retrograde scan circuit coupled to the translator that provides a retrograde signal that adjusts the position signal to offset a raster scan movement of the beam. The shape signals control the shaping of the beam, the position signal specifies a position of the beam for writing the shape on a substrate, and the duration signal specifies a duration of exposure of the beam on the substrate.

10 Claims, 20 Drawing Sheets

| $a_{11}$ | $a_{12}$ | $a_{13}$ | $a_{14}$ |
|---|---|---|---|
| $a_{21}$ | $a_{22}$ | $a_{23}$ | $a_{24}$ |
| $a_{31}$ | $a_{32}$ | $a_{33}$ | $a_{34}$ |
| $a_{41}$ | $a_{42}$ | $a_{43}$ | $a_{44}$ |

Matrix A

| $b_{11}$ | $b_{12}$ | $b_{13}$ | $b_{14}$ |
|---|---|---|---|
| $b_{21}$ | $b_{22}$ | $b_{23}$ | $b_{24}$ |
| $b_{31}$ | $b_{32}$ | $b_{33}$ | $b_{34}$ |
| $b_{41}$ | $b_{42}$ | $b_{43}$ | $b_{44}$ |

Matrix B

*FIG. 9*

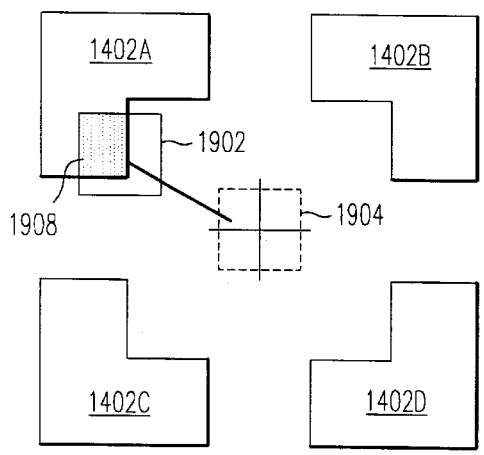
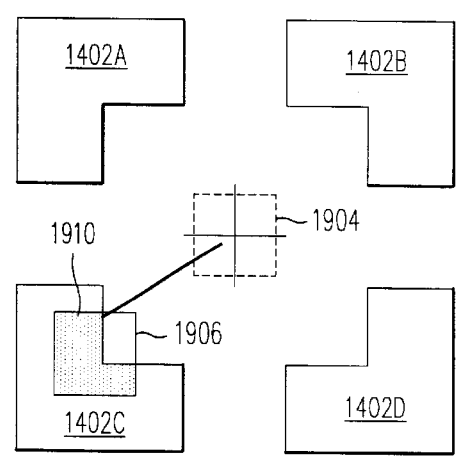
FIG. 19A    FIG. 19B
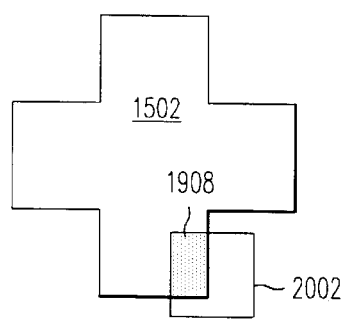
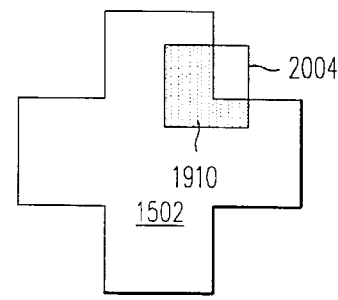
FIG. 20A    FIG. 20B

APPARATUS AND METHOD FOR CONTROLLING A BEAM SHAPE

BACKGROUND

1. Field of the Invention

The present invention relates to lithography and to electron (or other energy) beam columns and more specifically to a structure and method for generating variable shaped beams.

2. Description of The Related Art

It is well known in the field of lithography (pattern generation) that it is desirable to increase the throughput of pattern generation systems. Two main applications for such pattern generation systems are making masks for use in semiconductor fabrication by electron beam lithography and electron beam direct writing of patterns onto wafers to form semiconductor devices.

Lithography systems generate or expose patterns by controlling the flow of energy (the beam) from a source to a substrate coated with a layer sensitive to that form of energy. Pattern exposure is controlled and broken into discrete units commonly referred to as flashes, wherein a flash is that portion of the pattern exposed during one cycle of an exposure sequence. Flashes are produced by allowing energy from the source, for example light, electron or other particle beams, to reach the coated substrate within selected pattern areas. The details of flash composition, dose and exposure sequence used to produce a pattern, and hence the control of the lithographic system, make up what is known as a writing strategy.

A traditional raster scan writing strategy employs a uniform periodic raster scan, somewhat similar to television raster scanning. A mechanical stage moves a substrate, for example placed on a table, uniformly in a direction orthogonal to the direction of the uniform scan of an energy beam. In this manner a pattern is composed on a regular grid with a regular scan trajectory resulting from the orthogonal movement of the stage and beam. When the beam is positioned over a grid site requiring exposure, the beam is unblanked and the underlying site exposed. Only the amount of dose, or energy, at each site is varied as required. Hence, exposure data can be organized in a time sequence corresponding to the regular scan trajectory, and only the dose for each site need be specified. The distinguishing characteristics of a traditional raster scan writing strategy are a small round beam exposing one site at a time, a periodic scan moving sequentially to each site of a grid and a rasterized representation of data corresponding to the required dose for each site or "pixel" of the grid.

On the other hand, in a typical vector scan writing strategy, the beam is positioned only over those sites that require exposure and then unblanked to expose the site. Positioning is accomplished by a combination of stage and beam movement in what is often referred to as a semi-random scan. Thus, data must be provided that includes both the dose and position of each flash or site exposed. Frequently vector scan strategies use a variable shaped beam, that is a beam capable of having a different size and/or shape for each flash. The pattern is then composed from these variable shapes. A shaped beam is capable of exposing multiple pixel sites simultaneously instead of one pixel site at a time as in a raster scan writing strategy. Where a variable shaped beam is used, the data must additionally include the location, size and shape for each flash. Thus the distinguishing characteristics of traditional vector scan writing strategies are a variable shaped and sized beam exposing multiple pixel sites in a single flash, a semi-random scan encompassing only those portions of a pattern to be exposed, and a vectorized representation of data including the location, size, shape and dose of each flash.

Both vector and raster scan writing strategies have advantages and disadvantages. Vector scan strategies can offer fine pattern definition. However, vector scan flash rates are typically slower than raster scan strategies due to settling time required between the relatively large beam deflections of the semi-random scan trajectory. For patterns with exposed portions that are finely detailed, vector scan strategies are relatively slower due to delays in settling of the electron beam shaping components which are capable of shaping the beam over a wide range of dimensions. Also, current density (current per unit area) is generally lower in vector scan strategies due to the need for the electron source to be capable of covering larger areas simultaneously, again leading to lower throughput. A drawback of raster scan writing processes is a relatively coarse pattern definition.

Thus it is desirable to develop an improved writing strategy that combines the advantages of a vector scan strategy, namely, fine pattern definition, with those of a raster scan strategy, namely, increased speed, to increase the throughput of pattern generation systems.

SUMMARY

An embodiment of the present invention provides a converter which generates signals to control a shaping of an energy beam that strikes a substrate, the converter including: a translator which translates received input shape data into shape and position signals, and translates input duration information into a duration signal, where the shape signals control the shaping of the beam, the position signal specifies a position of the beam on the substrate, and the duration signal specifies a duration of exposure of the beam on the substrate; a retrograde scan circuit that outputs a retrograde signal; an output circuit coupled to receive the shape signals, the retrograde signal, and the position signal, where the output circuit adjusts the position signal according to the retrograde signal and outputs the shape and adjusted position signals; and timer circuit coupled to receive the duration signal from the translator circuit, where the timer circuit controls a duration the output circuit outputs the shape signal.

An embodiment of the present invention provides a method of generating signals that control a shaping of an electron (or other energy) beam that strikes a substrate, the method including the acts of: receiving data defining the shape of the beam; translating the shape data into shape and position signals; translating duration information pertaining to the beam into a duration signal, where the shape signals control the shape of the beam, the position signal specifies a position of the beam on the substrate being written by the beam, and the duration signal specifies a duration of exposure of the beam on the substrate; providing a retrograde signal with the position signal that offsets a raster scan movement of the beam; and outputting the shape signals based on the duration signal.

The present invention will be more fully understood in light of the following detailed description taken together with the accompanying drawings.

BRIEF DESCRIPTION OF THE DRAWINGS

FIG. 9 depicts matrix A and matrix B in more detail.

FIG. 19A depicts a top plan view of lower aperture 1214A with blanking position 1904 and shape 1908 generated using openings 1402A–1402D.

FIG. 19B depicts a top plan view of lower aperture 1214A with blanking position 1904, and shape 1910 generated using openings 1402A–1402D.

FIG. 20A depicts an example of a shaping of the cross section of electron beam 1222 as shape 1908 of FIG. 19A using opening 1502 of lower aperture 1214B.

FIG. 20B depicts an example of a shaping of the cross section of electron beam 1222 as shape 1910 of FIG. 19B using opening 1502 of lower aperture 1214B.

Note that use of the same reference numbers in different figures indicates the same or like elements.

DETAILED DESCRIPTION

System Overview

This disclosure is directed to a system and process for generating and writing electron (or other energy) beams with specified cross sectional shapes directed onto a substrate in a conventional "regular periodic trajectory" raster scan. One embodiment generates electron beams whose largest cross sectional shapes are smaller than that of an electron beam cross section generated by a conventional vector shaped beam apparatus. Thus this embodiment allows for smaller pattern definition than with a conventional vector shaped beam apparatus.

Figure 1:
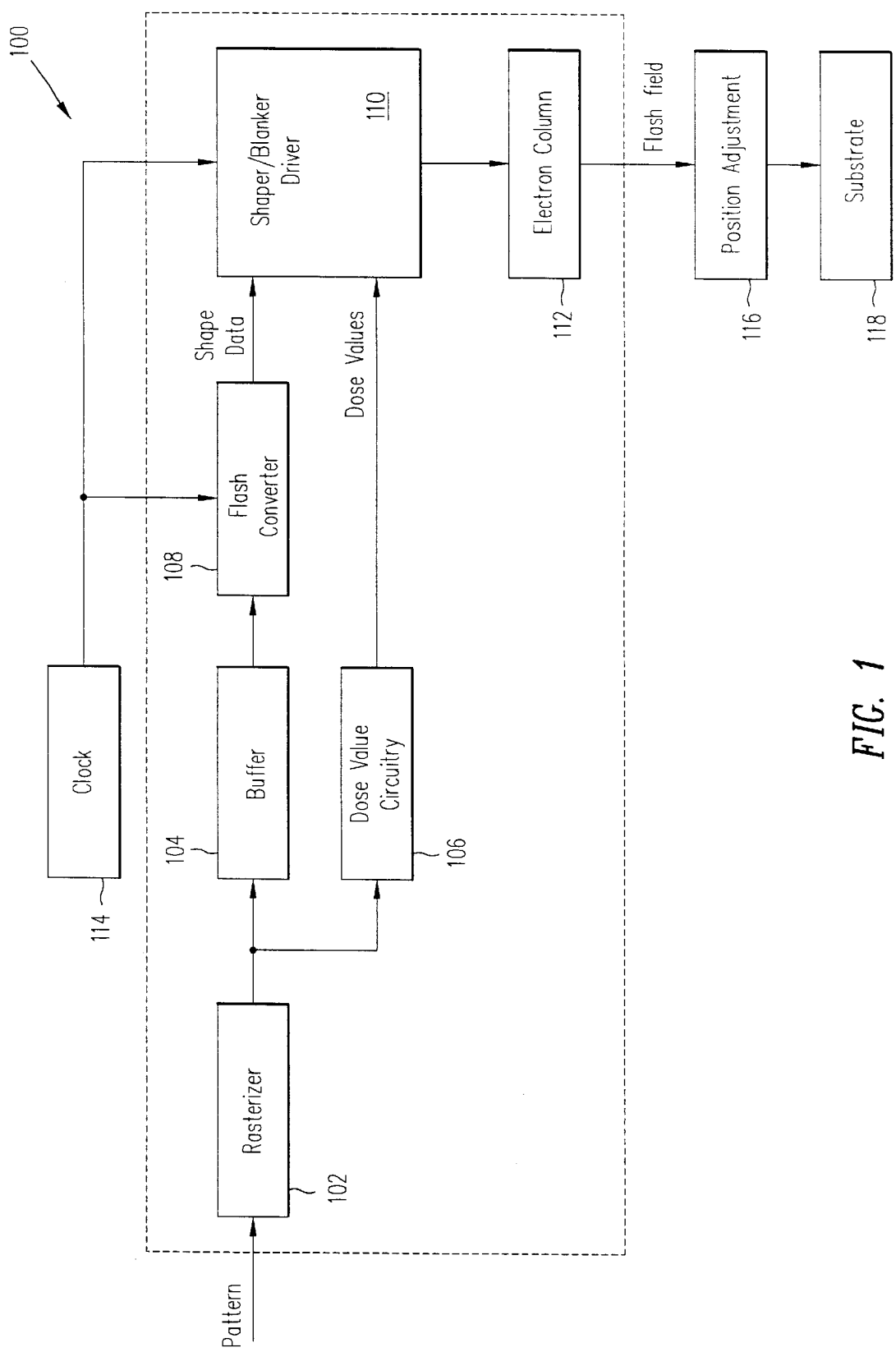
FIG. 1 depicts a block diagram of a system 100 in accordance with an embodiment of the present invention.

FIG. 1 depicts a block diagram of a lithography (imaging) system 100 in accordance with this embodiment including a rasterizer circuit 102, a buffer circuit 104, a dose value circuitry 106, a flash converter 108, shaper/blanker driver 110, and electron beam column 112. Flash converter 108 and shaper/blanker driver 110 are each coupled to receive a clock (timing) signal from clock 114. In this example, the clock signal frequency of clock 114 is 800 MHz. For detail of rasterizer circuit 102, buffer circuit 104, dose value circuitry 106, flash converter 108, shaper/blanker driver 110, and electron beam column 112, see below. All dimensions and parameters herein are exemplary.

In this embodiment, rasterizer circuit 102 first receives (e.g. from a conventional lithography data structure) a pattern that is to be written onto a substrate 118 specified by its shape location on the substrate (so called "vector format"). Rasterizer 102 then divides the surface of the substrate 118 into a grid of pixels and represents each pixel as a "gray level value" which specifies a fraction of the pixel's area which includes part of the pattern. Rasterizer 102 outputs each gray level value to both buffer 104 and dose value circuitry 106. (The connecting lines in FIG. 1 inside the dotted lines typically represent multi-line data busses.) Buffer 104 provides gray level values to flash converter 108. In this embodiment, flash converter 108 represents each square arrangement (2 dimensional) of four pixels ("quadrant") as a flash field that may be exposed in one flash cycle (hereafter the term "flash field" represents a blank or a shape that electron beam column 112 writes onto substrate 118). In other embodiments, flash converter 108 may represent a flash field as an N by M pixel rectangle, a larger or smaller sized square arrangement, or other shape. Flash converter 108 specifies each flash field by shape class and coordinates (shape_x, shape_y) (hereafter the term "shape data" refers to both shape class and coordinates). Dose value circuitry 106 receives gray level values associated with each quadrant from the rasterizer circuit 102 and outputs dose values associated with each flash field.

Shaper/blanker driver 110 requests shape data and corresponding dose values (hereafter shape data and corresponding dose values are referred together as a "flash data") from respective flash converter 108 and dose value circuitry 106. In one embodiment, flash converter 108 and dose value circuitry 106 provide a flash data to shaper/blanker driver 110 approximately every 10 ns. Shaper/blanker driver 110 converts each flash data to voltage values and provides the voltages to control electron beam column 112 to write the specified flash field in a proper location on the substrate 118. In this embodiment, electron beam column 112 writes a new flash field every 10 ns (hereafter "flash cycle"). For a blank flash field, electron beam column 112 does not write the electron beam onto substrate 118. An ion beam column or other energy beam (e.g., laser) may be substituted for column 112.

Electron beam column 112 writes flash fields in, e.g., a conventional "regular periodic trajectory" raster scan. In this embodiment, a conventional "regular periodic trajectory" raster scan can be a "unidirectional" type or a "bidirectional" type. "Regular periodic trajectory" means that the scan moves uniformly and periodically, and the motion is not controlled by pattern data. In a "unidirectional" type, a scan of a grid begins with, e.g., a lower left corner of the grid defined on a portion of the substrate and proceeds to the top left corner of the grid, then returns to the bottom of the next leftmost column with the beam blanked, and continues to scan the next leftmost column in the same direction as the first, i.e. from bottom to top. Scanning continues in the same manner until the entire grid to be patterned is covered. In a conventional "bidirectional" type raster scan, a scan of a grid begins with, e.g., a lower left corner of the grid defined on a portion of the substrate and proceeds to the top left corner of the grid, and continues to scan the next leftmost column in the opposite direction to the first, i.e. from top to bottom. Scanning continues in such up-then-down order until the entire grid to be patterned is scanned.

Prior art vector scan systems require large data buffers that store vector scanned patterns. Pattern sizes are highly variable and so a data buffer adequate to store pattern data in vector format has a very large storage capacity. However, the large data capacity of the buffer increases cost. The present embodiment employs real-time processing of flash field data to avoid the large data buffer of the prior art. In this embodiment, rasterizer 102, flash converter 108, dose value circuitry 106, and shaper/blanker driver 110 together process the shape and duration of a flash field immediately prior to flash field generation by electron beam column 112.

Rasterizer Circuit 102

Figure 2A:
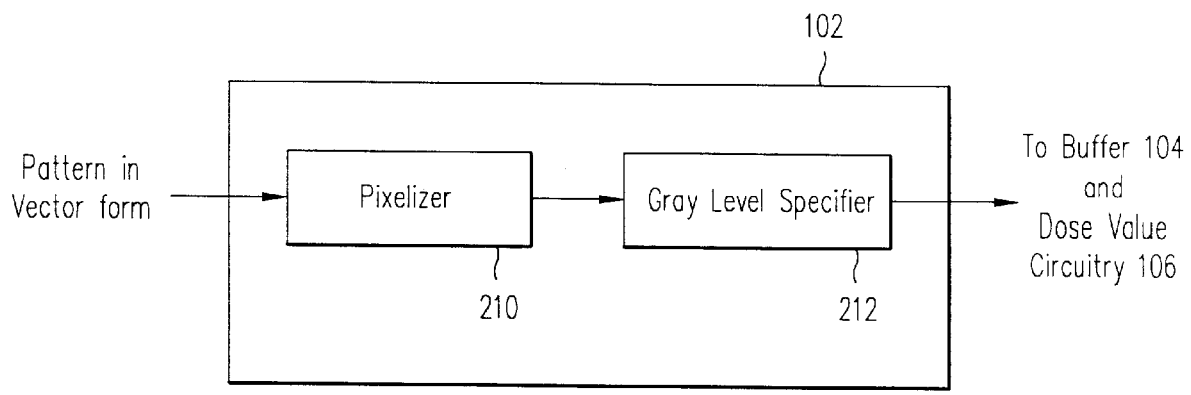
FIG. 2A depicts a block diagram of a suitable rasterizer 102 in accordance with an embodiment of the present invention.

In accordance with an embodiment of the present invention, FIG. 2A schematically depicts a suitable rasterizer circuit 102. Rasterizer circuit 102 includes a pixelizer 210 and gray level specifier 212. In one embodiment, rasterizer 102 is "hardwired" logic circuitry that performs a process 200 described in more detail below with respect to FIG. 2B. In other embodiments, rasterizer 102 may be a computer that implements a software form of process 200. All parameters herein are exemplary.

Rasterizer 102 receives as an input signal data in vector format representing a conventional pattern to be written on a substrate. The pattern conventionally defines, e.g., a layer of an integrated circuit, and is expressed in x-y coordinates. Rasterizer 102 decomposes a pattern image to be written onto a portion of the substrate into a grid of pixels and represents each pixel as a gray level value which specifies a fraction of a pixel which includes a pattern.

Figure 2B:
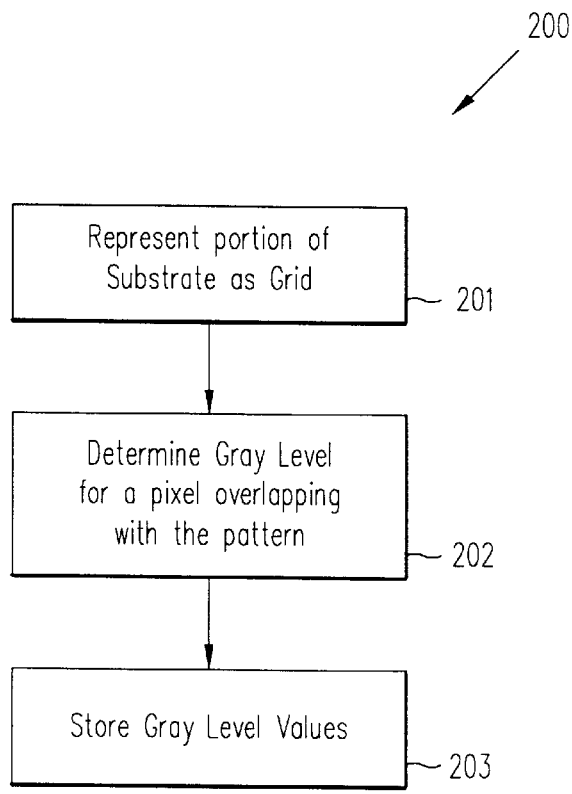
FIG. 2B depicts a flow diagram of a suitable process 200 executed by rasterizer 102 in accordance with an embodiment of the present invention.

FIG. 2B depicts a flow diagram of a suitable process 200 executed by rasterizer 102 to represent the pattern image to be written on a surface of the substrate as gray level values.

Figure 3:
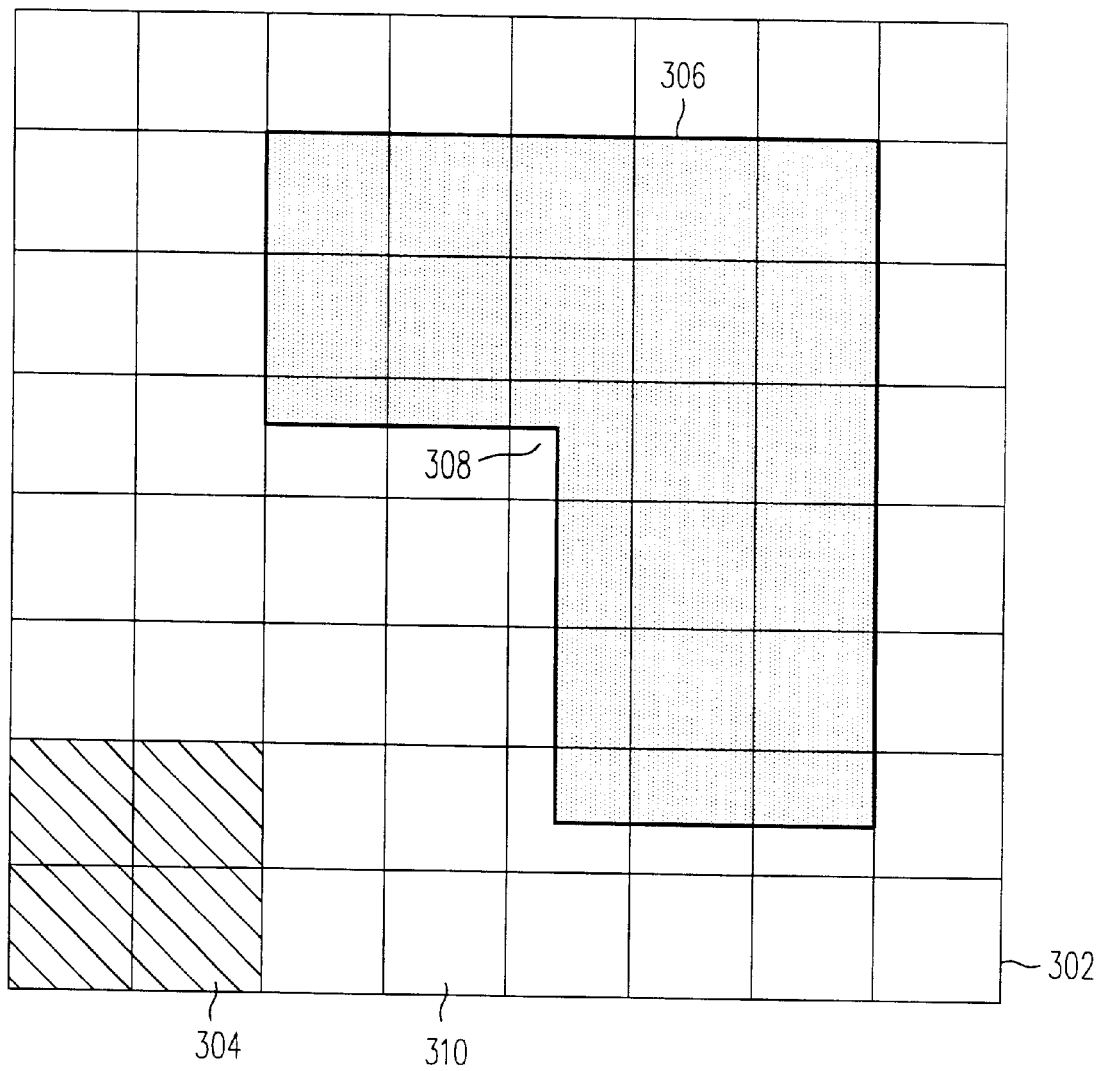
FIG. 3 depicts an example portion of a grid 302 that divides a portion of the surface of the substrate, including pattern 306, into pixels 310 in accordance with an embodiment of the present invention.

In 201, pixelizer 210 divides a portion of the substrate surface into a grid. Pixelizer 210 further positions any pattern, where specified, within the grid. In this embodiment, each grid is at most, e.g., 8,192 pixels by 1,440,000 pixels. For imaging a mask requiring a minimum feature size of 200 nm, each pixel is square shaped and approximately 100 nm on a side, although other pixels shapes can be used. FIG. 3 depicts an example portion of a grid 302 that divides a portion of the surface of the substrate, on which is imaged pattern 306, divided into pixels 310.

Figure 4:
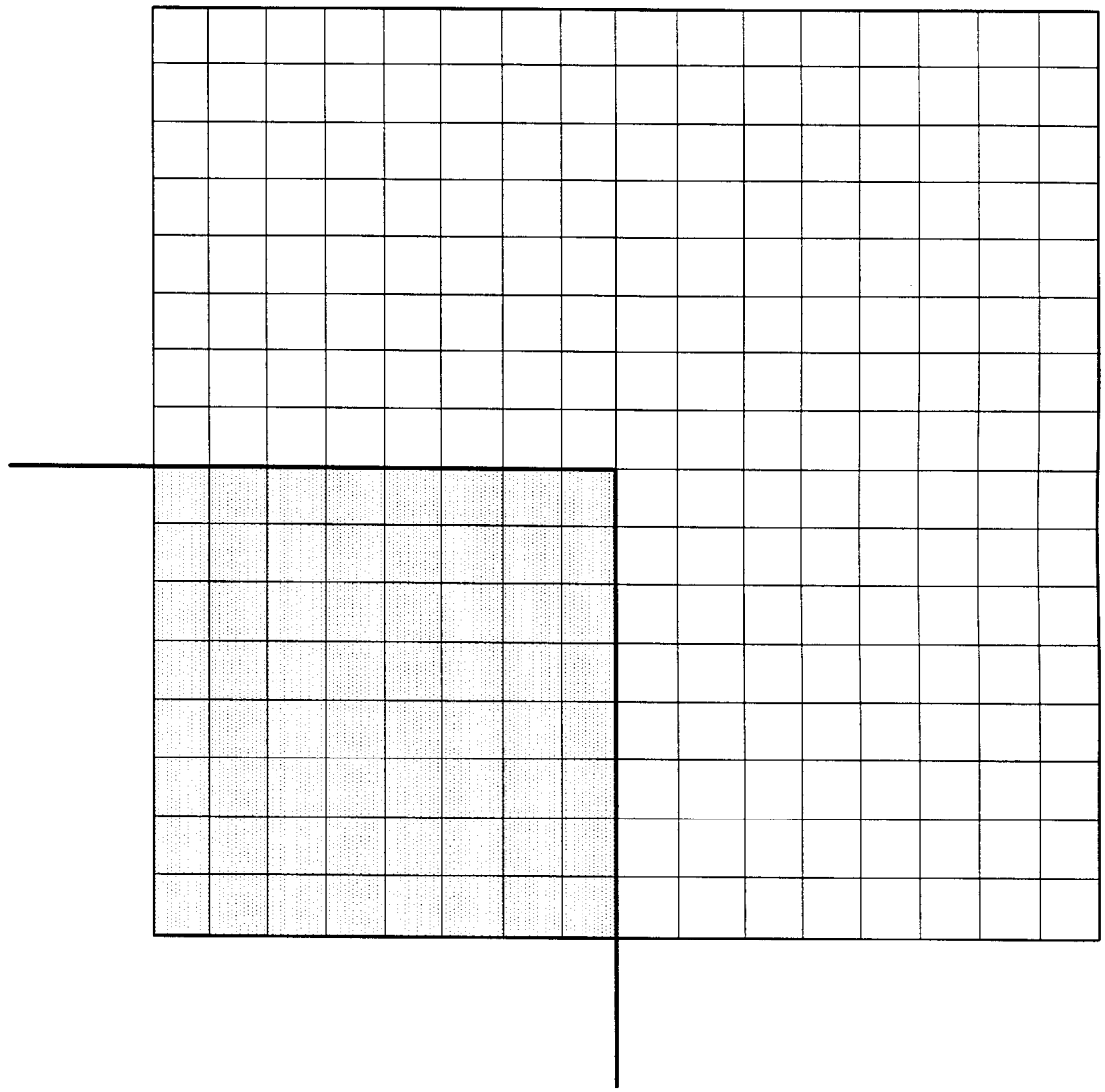
FIG. 4 depicts an example of a corner of a pattern within a pixel.

In 202 of FIG. 2, pixelizer 210 passes the grid to gray level specifier 212, which represents each pixel 310 by a gray level value. The gray level value represents a proportion of subpixels within a pixel 310 that overlap with pattern 306. In this embodiment of the present invention, gray level values range from 0 to 16. For example, a pixel including no pattern 306 has a gray level value of 0. FIG. 4 depicts an example of a corner of a pattern within a pixel. In the example, 64 (those pixels at the edge of the dark area) out of 256 sub-pixels are overlapped thus representing a gray level value of 4. In this embodiment, gray level specifier 212 specifies each gray level value by a 5 bit value thus allowing up to 32 gray levels.

In 203, rasterizer 102 stores the gray level values associated with the grid in buffer 104.

Subsequently, rasterizer 102 repeats process 200 of FIG. 2B until approximately all of the image to be written on the substrate is represented by pixels.

In conventional vector scan apparatuses, only patterns that are to be written on a substrate are coded. In this embodiment, the rasterizer divides a portion of the surface of the substrate into a grid and represents every pixel on the surface. The representation of a full substrate image provides many advantages over conventional vector format representations of patterns, particularly because each pixel, regardless of whether it includes a pattern, is represented.

For example, conventional proximity error corrections can be calculated more readily because each pixel, whether or not exposed, is represented. Proximity error correction involves adjusting a level of electron beam exposure to a particular area of a substrate to avoid overexposure by considering exposure to pixels adjacent to the area. If the patterns are in vector format, determining the proximity of patterns requires numerous calculations.

Overlap determination can be calculated more readily in this embodiment. Overlap determination is required to prevent overexposure of a region where multiple patterns overlap. With patterns in vector format, each pattern is coded separately, even the overlapping patterns. Thus to determine overlap requires numerous calculations. Since every pixel is represented by gray level values in this embodiment, it is much easier to determine overlap.

Sometimes patterns must be "tone reversed", i.e. normally unexposed portions of a substrate are exposed and normally exposed pattern portions are not to be exposed. In this embodiment, pixels can easily be tone reversed because even the normally unexposed pixels are represented. For patterns in vector format, only exposed areas are coded, so it is difficult to tone reverse the unexposed areas.

With vector format patterns, the number of flash fields in a pattern may be enormous and therefore requires an impractically large buffer space. In this embodiment each pixel is represented individually, so the pixels can be loaded in a buffer space in discrete steps, even partitioning a pattern. In this embodiment, the rasterizer 102 outputs gray level values to buffer device at a constant rate, thereby allowing buffer 104 to include less storage space than in the prior art.

Flash Converter 108

Figure 5A:
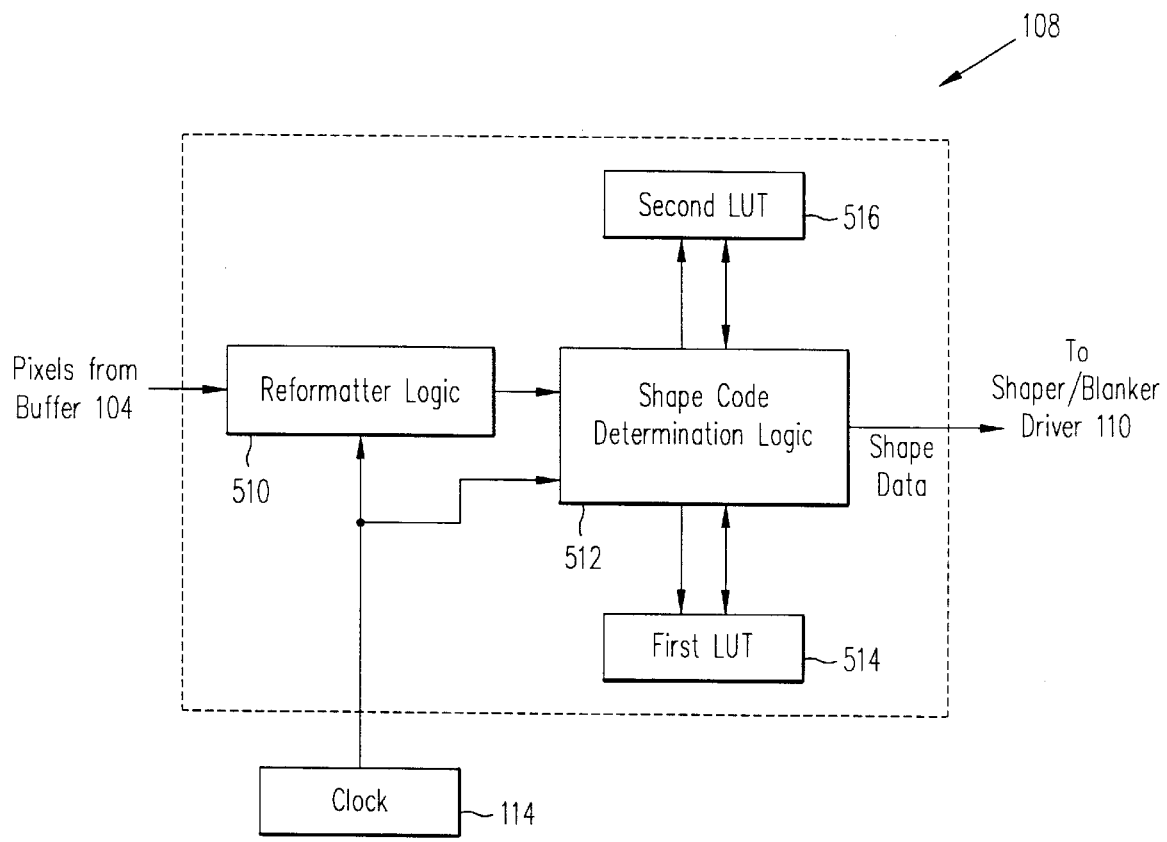
FIG. 5A depicts a suitable flash converter 108 in block diagram form in accordance with an embodiment of the present invention.

Flash converter 108 converts gray level values of pixels into shape data that specify the shape of a flash field. FIG. 5A depicts a suitable flash converter 108 in block diagram form. As shown, flash converter 108 includes reformatter logic 510, shape code determination logic 512, first lookup table (LUT) 514, and second LUT 516. A suitable implementation of first and second LUTs 514 and 516 is static random access memory (SRAM). Flash converter 108 is coupled to receive gray level values from buffer 104 and a clock signal from clock 114. Flash converter 108 outputs shape data to shaper/blanker driver 110 in accordance with clock signal from clock 114.

In this embodiment, flash converter 108 is hardwired logic that performs process 500 discussed below with respect to FIG. 5B. In other embodiments, flash converter 108 may be a computer that implements a software form of process 500. Appendix B is a Pascal computer language simulation of process 500 as carried out by the hardwired logic implementation of flash converter 108. All parameters herein are exemplary.

In 501, buffer 104 provides a signal having, e.g., at least 16 gray level values to reformatter logic 510. In this embodiment the gray level values correspond to a square formation of 4 by 4 pixels (hereafter "matrix A") with a quadrant of interest in the center. FIG. 9 depicts matrix A in more detail. The quadrant of interest corresponds to pixels a22, a23, a32, and a33 and the remaining pixels are "surrounding pixels". For quadrants on the edges of a grid, pixels surrounding the quadrants that are not within the grid have a gray level value of 0. Flash converter 108 represents the quadrant of interest as shape data.

In a first execution of 501, buffer 104 first outputs the data pertaining to the bottom left hand quadrant. In subsequent executions of 501, buffer 104 outputs data pertaining to quadrants in the raster scan described earlier.

In 502, reformatter logic 510 represents the quadrant by shape data, i.e., a shape code and coordinates (shape_x, shape_y). The shape code represents a basic shape that ranges from a quadrant that is to be fully exposed by the beam to a non-exposed quadrant. The coordinates modify basic shapes by subpixels so that the modified shape better approximates the portion of a pattern within the quadrant. The shape of each flash field is specified by a shape code and coordinates.

Figure 6:
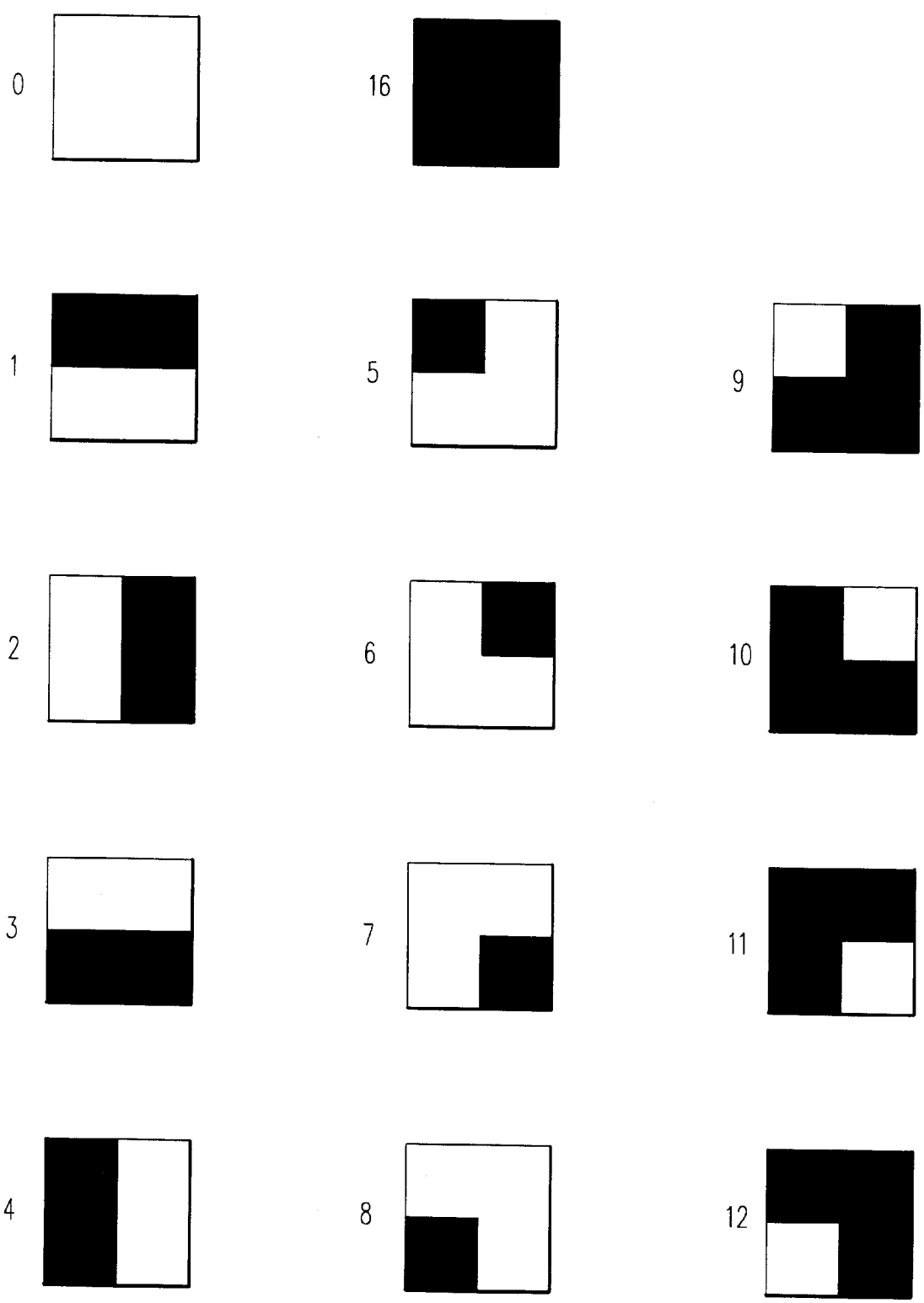
FIG. 6 depicts 14 basic shapes, each within a quadrant 304, and associated shape codes in accordance with an embodiment of the present invention.

FIG. 6 depicts 14 basic shapes, each within a quadrant 304, and associated assigned shape codes in accordance with this embodiment. The dark portion of each shape represents an area that is to be exposed by the (electron) beam ("exposed area"). The largest exposed area is a full quadrant and corresponds to shape code 16. Shape codes 1 to 4 specify rectangular shaped exposed areas with four different rotations. Shape codes 5 to 8 specify exposed areas that can be either square or rectangular shaped with four different rotations. Shape codes 9 to 12 represent L-shaped exposed areas with four different rotations. In other embodiments, shape codes can represent other shapes.

Figure 7:
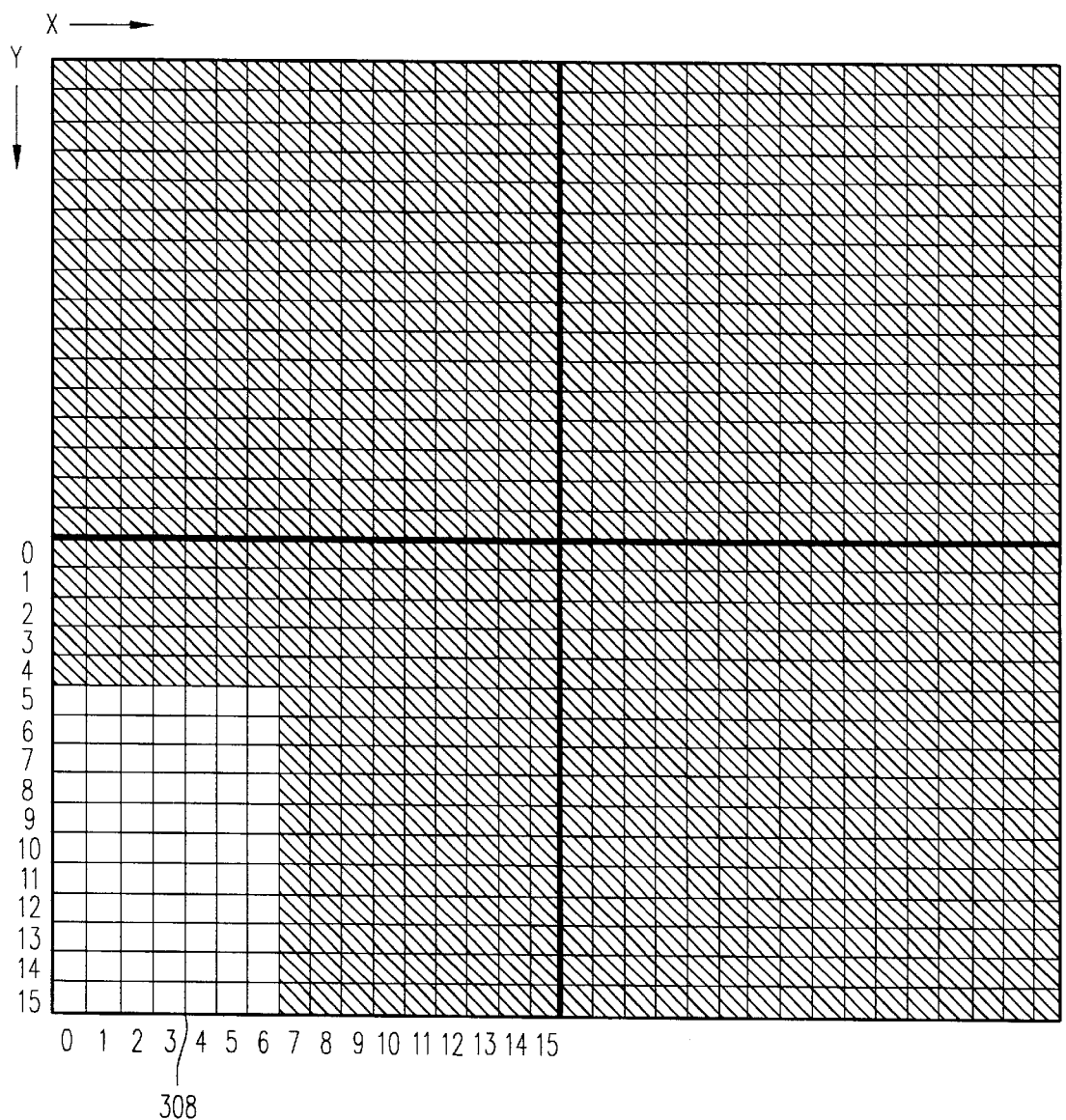
FIG. 7 shows an enlarged view of portion 308 of pattern 306 within a quadrant.

The coordinates modify shapes corresponding to shape codes 1 to 12 by sub-pixels. In this embodiment, shape_x and shape_y each take on values 0 to 31. For example, FIG. 7 shows an enlarged view of portion 308 of pattern 306 within a quadrant. Portion 308 corresponds to a shape code of 12. In the example, alteration of the shape with shape code 12 is accomplished by specifying coordinates shape_x and shape_y of (19,20). In the example, the coordinates specify the corner position of the shape.

Figure 8:
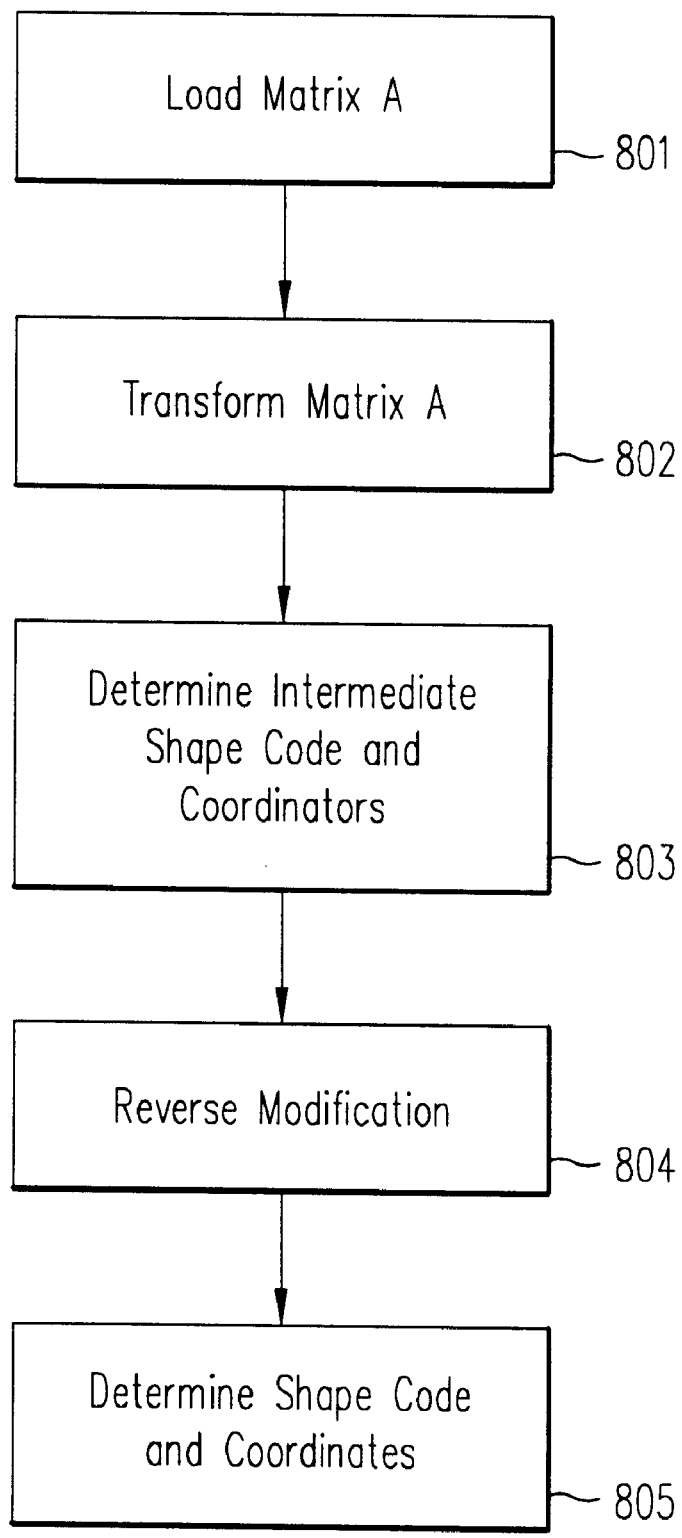
FIG. 8 depicts a flow diagram of the process of 502 of FIG. 5B in more detail in accordance with an embodiment of the present invention.

FIG. 8 depicts a flow diagram of the process of 502 in more detail. In 801, reformatter logic 510 loads matrix A.

In 802, reformatter logic 510 modifies matrix A so that pixel a22 has the highest gray level value among the quadrant of interest by any or all of three operations: 1) rotation, 2) flipping, or 3) reverse toning. Variable "rotate" takes on values of 0, 1, 2, or 3, and represents whether matrix A has been rotated respectively by either 0, 90, 180, or 270 degrees. Variable "flip" specifies whether the matrix A has been "flipped", i.e., for each pixel, exchanging coordinates shape_x and shape_y but retaining the gray level value. Variable "reverse" specifies whether to represent each gray level value as 16 minus its gray level value. Reformatter logic 510 stores the variables and records the order of operations for later use. The resulting matrix is matrix B, shown in FIG. 9. Reformatter logic 510 then outputs the matrix B and the variables and the order of operations to shape code determination logic 512.

Figure 10:
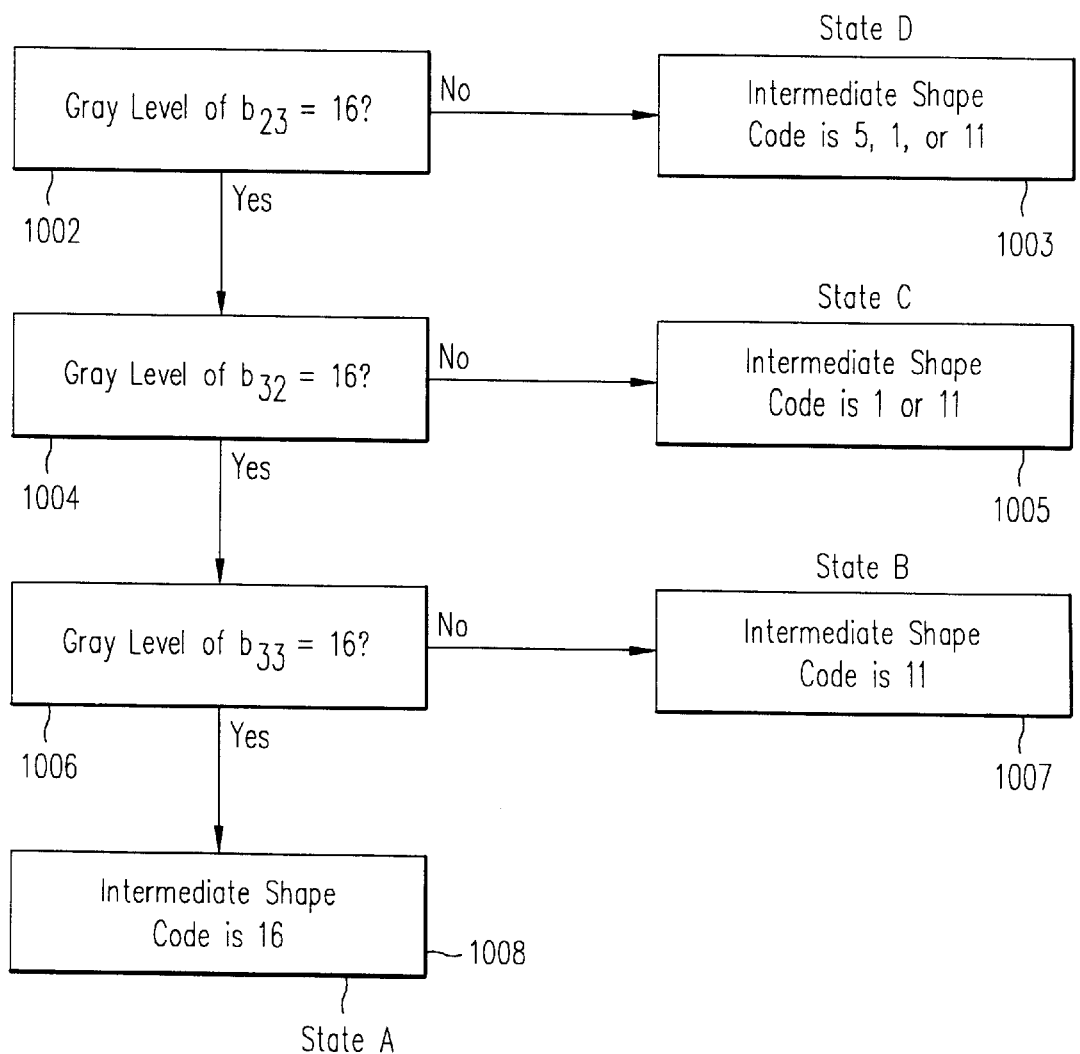
FIG. 10 depicts a process to determine an intermediate shape code in accordance with an embodiment of the present invention.

In 803, shape code determination logic 512 applies a process shown in FIG. 10 to the center four pixels of matrix B to determine an intermediate shape code. First, in 1002, shape code determination logic 512 determines if the pixel b23 has a gray level value of 16. If not, in 1003, the intermediate shape code is either 5, 1, or 11 (state D). If so, then in 1004, shape code determination logic 512 determines if pixel b32 has a gray value of 16. If not, in 1005, the intermediate shape code is either 1 or 11 (state C). If so, then in 1006, shape code determination logic 512 determines if pixel b33 has a gray value of 16. If not then in 1007, the intermediate shape code is 11 (state B). If so, then in 1008, the intermediate shape code is 16 (state A).

Thus if the state is C or D, shape code determination logic 512 subsequently determines intermediate coordinates and an intermediate shape code. For state B, shape code determination logic 512 subsequently determines only intermediate coordinates by which to modify the shape corresponding to the intermediate shape code of 11. For state A, no coordinates need be determined.

In this embodiment, for state B, to determine intermediate coordinates, shape code determination logic 512 provides gray level values of pixels shown in Table 1 to first lookup table 514 which in turn outputs the corresponding intermediate coordinates. For states C–D, to determine intermediate coordinates and an intermediate shape code, shape code determination logic 512 outputs gray level values of pixels shown in Table 1 to first lookup table 514 which in turn outputs the intermediate coordinates and intermediate shape code.

TABLE 1

| State | pixels considered |
|---|---|
| B | b33, b34, b43, and b44 |
| C | b31, b32, b33, b34, and b42 |
| D | b22, b23, b32, b33, and b42 |

Figure 11:
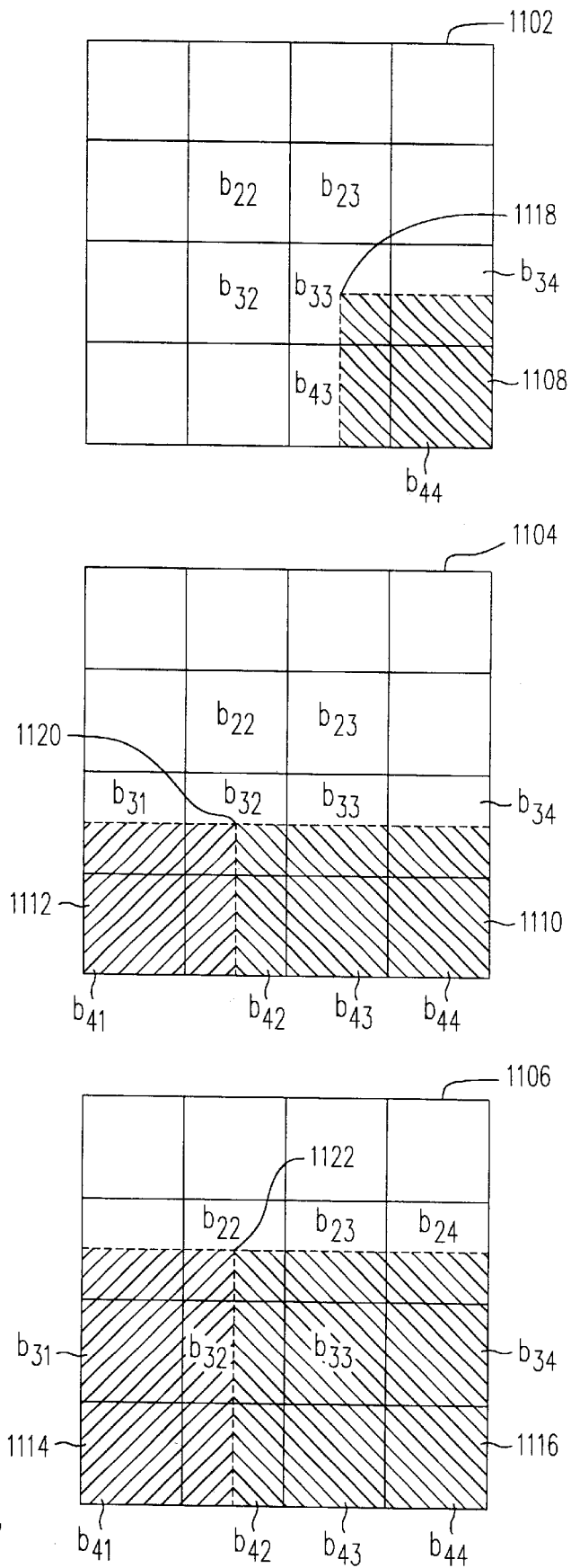
FIG. 11 depicts an example of unexposed portions of a matrix B for states B–D in accordance with an embodiment of the present invention.

For state B, the intermediate coordinate entries in first lookup table 514 are derived as follows. Pixels b22, b23, and b32 have gray level values of 16. The gray level value of pixel b33 is specified but the exposed sub-pixels are not specified. Thus a single gray level value could correspond to a variety of exposed sub-pixels. In this embodiment it is assumed that a corner is formed through pixels b34, b33, and b43 (broken lines in matrix 1102 of FIG. 11), with the intersection of the sides of the corner at edge point 1118 in pixel b33. The interior shaded region of corner 1108 is not exposed. The angle between the sides intersecting edge point 1118 is not necessarily 90 degrees. In this embodiment, the coordinates of the edge point 1118 and hence the exposed portion of pixel b33 is estimated by determining a corner 1108 through pixels b34, b33, and b43 that corresponds to a minimum gray level error. Specifically, each coordinate in first lookup table 514 corresponds to a minimum error between 1) the specified gray level values of the flash field and pixels b34, b43, and b44 and 2) the gray level values of the resulting flash field and the pixels b34, b43, and b44 with the edge point set at the coordinate.

In this embodiment, the formula given below is calculated for each coordinate from (16,16) to (31,31) for all possible gray level values. Each intermediate coordinate in first lookup table 514 corresponds to the minimum error value from the following formula:

$$\text{Error}=K(F)+L(PE)+M(T) \quad (1)$$

Variable F represents the absolute value of the difference between the specified total gray level value of the flash field and the total gray level value of the flash field achieved by a coordinate.

Variable PE represents a maximum error between each gray level value of each pixel in Table 1 for state B and the gray level values of the pixels in Table 1 for state B achieved by a coordinate.

Variable T represents the sum of variable F and the sum of absolute differences between each specified gray level value of each pixel in Table 1 for state B and the gray level values of the pixels in Table 1 for state B achieved by a coordinate.

In one embodiment, weighting variables K, L, and M are respectively 8, 4, and 1. This weighs most heavily the variable F.

For state C, the intermediate coordinate entries in first lookup table 514 are derived as follows. Pixels b22 and b23 have gray level values of 16. The gray level values of pixels b32 and b33 are specified but the exposed sub-pixels are not. Since the exposed portion of the quadrant can correspond to shape code 1 or 11, either a corner is formed through pixels b32, b33, b34, and b42 or a straight edge is formed through pixels b32, b33, b34, and b31 (broken lines in matrix 1104 of FIG. 11). The angle between sides of the corner can be other than 90 degrees. For the corner that corresponds to a shape code of 11, intermediate coordinates specify the intersection of sides at edge point 1120 in pixel b32. The unexposed portion of the corner is shown as region 1110 and the unexposed portion of the straight edge is shown as regions 1110 and 1112 together.

For state C, the intermediate shape codes and intermediate coordinates for each combination of gray level values for pixels b31, b32, b33, b34, and b42 specified in the lookup table correspond to minimum error values from the formula. The formula discussed earlier is calculated for each of shape codes 1 and 11 and coordinates ranging from (0,16) to (31,31). In the formula, variable PE represents a maximum error between each gray level value of each pixel in Table 1 for state C and the gray level values of the pixels in Table 1 for state C achieved by a coordinate. Variable T represents the sum of variable F and the sum of absolute differences between each specified gray level value of each pixel in Table 1 for state C and the gray level values of the pixels in Table 1 for state C achieved by a coordinate.

For state D, the intermediate coordinate entries in first lookup table 514 are derived as follows. The gray level values of pixels b22, b23, b32, and b33 are specified but the exposed sub-pixels are not. As the exposed portion of the quadrant can correspond to shape code 1, 5, or 11, either a corner is formed through pixels b42, b32, b22, b23, and b24 or a straight edge is formed through pixels b21, b22, b23, and b24 (broken lines in matrix 1106 of FIG. 11). The unexposed portion of the corner is shown as region 1116 and the unexposed portion of the straight edge is shown as regions 1114 and 1116 together. For the corner that corresponds to a shape code of 11 or 5, coordinates specify the intersection of sides at edge point 1122 through any pixel of the quadrant. The angle between sides of edge point 1122 can be other than 90 degrees. For example, a shape code 5 could correspond to the angle between sides of corner of more than 90 degrees.

For state D, the intermediate shape codes and intermediate coordinates for each combination of gray values for pixels b22, b23, b32, b33, and b42 specified in first lookup table 514 correspond to minimum error values from the formula. The formula discussed earlier is calculated for each of shape codes 1, 5, and 11 and coordinates ranging from (0,0) to (31,31). In the formula, variable PE represents a maximum error between each gray level value of each pixel in Table 1 for state D and the gray level values of the pixels in Table 1 for state D achieved by a coordinate. Variable T represents the sum of variable F and the sum of absolute differences between each specified gray level value of each pixel in Table 1 for state D and the gray level values of the pixels in Table 1 for state D achieved by a coordinate.

In 804 of FIG. 8, for all states, shape code determination logic 512 reverses any modification performed by reformatter logic 510 in 802 in a reverse order on the shape specified by shape code and coordinates determined in 803. In this embodiment, shape code determination logic 512 accesses second lookup table 516 that includes coordinates and shape codes for every combination of reverse-transformation operations on every possible intermediate shape code and intermediate coordinates, i.e., shape codes 1, 5, or 11 and coordinates (0,0) to (31,31). In 805, shape code determination logic 512 reads the appropriate shape code and coordinates from second lookup table 516.

Figure 5B:
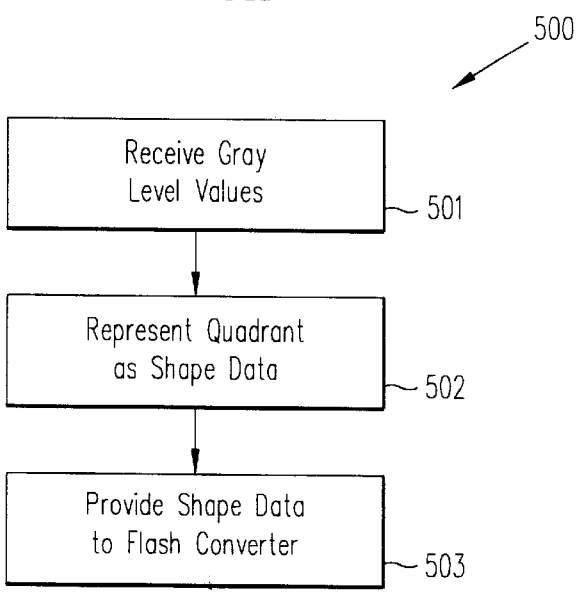
FIG. 5B depicts a suitable process implemented by flash converter 108 in accordance with an embodiment of the present invention.

In 503 of FIG. 5B, shape code determination logic 512 provides shape data to shaper/blanker driver 110. In this embodiment, flash converter 108 provides shape data to shaper/blanker driver 110 approximately every 10 ns.

Flash converter 108 repeats steps 501 to 503 for each quadrant in the grid until all quadrants in the grid specified in 202 of FIG. 2B are represented by shape data.

Advantageously this embodiment allows for a reduced number of look up table entries and circuitry necessary in load operations. First lookup table 514 includes coordinate entries for three shape codes, i.e. 1, 5, and 11. In this embodiment, $17^4$ values are needed in a look up table for state B and $17^5$ values are needed in a look up table for each of states C and D. Otherwise, lookup tables would be required for each of shape codes 1–12. Thus this embodiment reduces the number of costly lookup tables.

In this embodiment, each lookup table value requires 2 bytes, which includes a 5 bit shape_x coordinate and 5 bit shape_y coordinate value and a 5 bit shape code. In this embodiment each of first lookup table 514 and second lookup table 516 require approximately 6 megabytes.

Dose Value Circuitry 106

In one embodiment, dose value circuitry 106 receives gray level values among and around a flash field from rasterizer 102, selects three dose values, "dose1", "dose2", and "dose3", from a programmable lookup table, and outputs the dose values to shaper/blanker driver 110. Dose value entries associated with a shape data depend on arrangements and magnitudes of gray level values among the flash field represented by the shape data. In other embodiments, more or fewer dose values are associated with a flash field. Variable "dose1" specifies a level of conventional long range correction. Variable "dose2" specifies a level of conventional short range correction. Variable "dose3" specifies a level of gray level splicing correction. A suitable technique for generating dose values associated with each flash field is described in U.S. patent application Ser. No. 08/789,246, filed Jan. 28, 1997, now U.S. Pat. No. 5,847,959, commonly assigned, and Appendix A hereto, "Run-Time Correction of Proximity Effects in Raster Scan Pattern Generator Systems," L. Veneklasen, U. Hofmann, L. Johnson, V. Boegli, and R. Innes, presented at Micro- and Nano-Engineering 98, Leuven, Belgium, Sep. 22–24, 1998, both incorporated herein by reference in their entireties.

A suitable dose value circuitry 106 includes hardwired logic and a conventional memory such as static random access memory. In other embodiments, dose value circuitry 106 may be a computer that executes suitable software. All parameters herein are exemplary.

In this embodiment, dose value circuitry 106 provides dose values associated with each shape data to shaper/blanker driver 110 every 10 ns. Shaper/blanker driver 110, described in more detail below, translates dose values associated with each shape data into exposure times that specify the duration of time of a flash field, i.e. the time an area of the substrate is exposed to the beam.

Electron Beam Column 112

Figure 12:
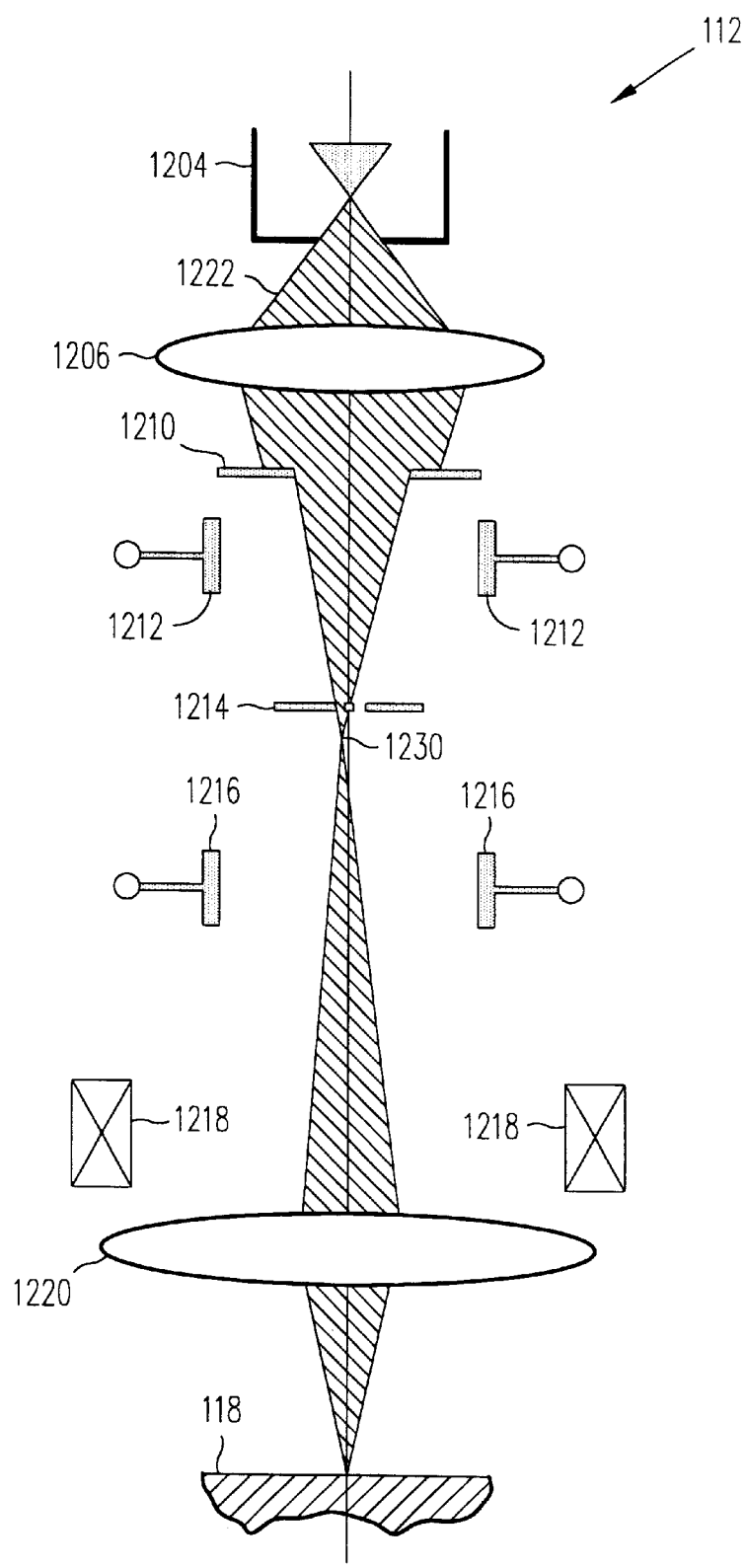
FIG. 12 depicts a schematic diagram of electron beam column 118 in accordance with an embodiment of the present invention.

FIG. 12 depicts schematically a suitable novel electron beam column 112 that generates flash fields specified by shape data in a raster scan. In this embodiment, electron beam column 112 generates flash fields by a "shadow projection" technique discussed in more detail below. Electron beam column 112 includes a conventional thermal field emission (TFE) electron source 1204, a conventional electron beam transfer lens 1206, upper aperture 1210, a conventional upper deflector 1212, lower aperture 1214, a conventional lower deflector 1216, conventional magnetic deflection coils 1218, and a conventional electron beam objective lens 1220. Electron beam column 112 writes flash fields on substrate 118.

All dimensions and parameters herein are exemplary. In other embodiments, electron beam column 112 could generate charged particle beams or other energy beams.

FIG. 12 illustrates an apparatus used for writing patterns with a minimum feature dimension of 200 nm on a mask. The apparatus of course can be altered for different minimum feature sizes. The maximum cross sectional beam size generated by electron beam column 112 corresponds to the minimum feature size of the resulting pattern.

Conventional thermal field emission (TFE) electron source 1204 outputs electron beam 1222. TFE electron source 1204 provides a current per unit solid angle, dI/dΩ, otherwise known as angular intensity, of at least 1.0 mA/steradian. TFE electron source 1204 outputs electron beam 1222 from approximately 420 mm above the surface of substrate 118.

Conventional transfer lens 1206 is positioned downstream with regard to the electron beam direction from TFE electron source 1204 (hereafter "downstream" means downstream with regard to the electron beam direction from TFE electron source 1204). Transfer lens 1206 is approximately 320 mm upstream from the surface of substrate 118. Conventional transfer lens 1206 focuses electron beam 1222 at crossover point 1230, approximately 1 mm downstream from the center, point C, of lower aperture 1214 described in more detail later.

Upper aperture 1210 is positioned downstream from transfer lens 1206. Upper aperture 1210 is positioned approximately 290 mm upstream from substrate 118. Upper aperture 1210 defines a square opening 1302 of approximately 135 μm by 135 μm. When upper aperture 1210 is illuminated by TFE electron source 1204, a well resolved shadow of square opening 1302 that corresponds to the cross section of the electron beam 1222 is projected downstream from upper aperture 1210. As shown in FIG. 12, the size of a cross section of the shadow of electron beam 1222 decreases downstream from upper aperture 1210 to the crossover point 1230.

Figure 13A:
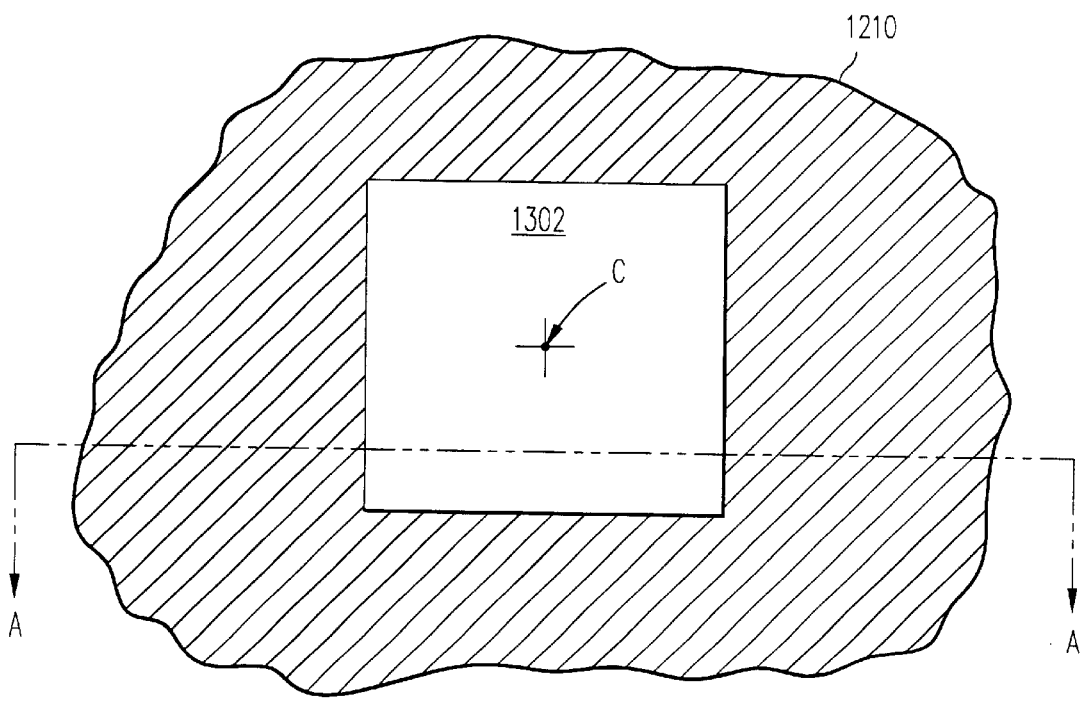
FIG. 13A depicts a plan view of a portion of upper aperture 1210 in more detail in accordance with an embodiment of the present invention.
Figure 13B:
FIG. 13B depicts a cross sectional view of upper aperture 1210 of FIG. 13A along line A—A in accordance with an embodiment of the present invention.

FIG. 13A depicts a plan view of a portion of upper aperture 1210 in more detail. In this embodiment, upper aperture 1210 defines a square opening 1302 of approximately 135 μm by 135 μm. Square opening 1302 is coaxial with electron beam 1222. FIG. 13B depicts a cross sectional view of upper aperture 1210 of FIG. 2A along line A—A. The thickness of upper aperture 1210 is approximately 10 μm.

In this embodiment, upper aperture 1210 is constructed by depositing a low stress refractory metal such as tungsten-titanium alloy on a silicon membrane and then patterning 135 μm by 135 μm square opening 1302 through both the alloy and the silicon membrane by use of a focused ion beam. In another embodiment, upper aperture 1210 is made of an approximately 10 μm thick foil of metal such as molybdenum, tungsten, or an alloy such as molybdenum-rhenium which may be heated by an electrical current to reduce contamination problems.

Referring to FIG. 12, conventional upper deflector 1212 is positioned downstream from upper aperture 1210. The operation and a suitable structure of upper deflector 1212 is described in more detail below.

Lower aperture 1214 is positioned downstream from upper deflector 1212. When lower aperture 1214 is illuminated by electron beam 1222, a well resolved shaped beam is further defined by the portion of the shadow of the opening defined by upper aperture 1210 that passes through the lower aperture 1214. As shown in FIG. 12, the size of a cross section of the shadow of electron beam 1222 decreases downstream from lower aperture 1214 to the crossover point 1230 and then increases downstream from crossover point 1230.

Electron beam 1222 converges to the crossover point 1230 close to lower aperture 1214. When electron beam 1222 impinges lower aperture 1214, the size of the cross section of electron beam 1222 is very small. The small cross sectional size in turn involves use of small shaper openings in lower aperture 1214. The cross sectional size of electron beam 1222 as electron beam 1222 impinges lower aperture 1214 can be adjusted by moving the crossover point 1230, which involves changing the strength of the transfer lens 1206.

Figure 14A:
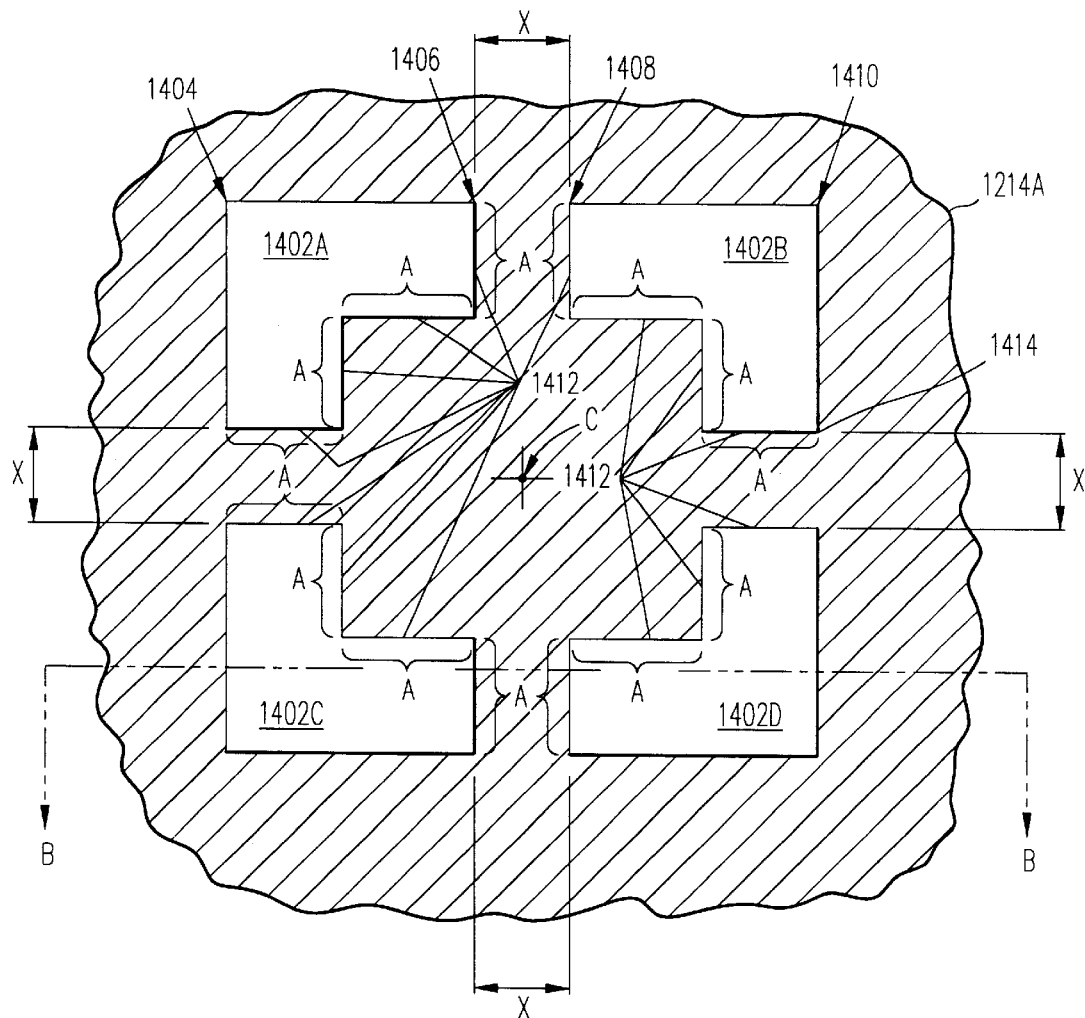
FIG. 14A depicts a plan view of a portion of lower aperture 1214A in accordance with an embodiment of the present invention.
Figure 14B:
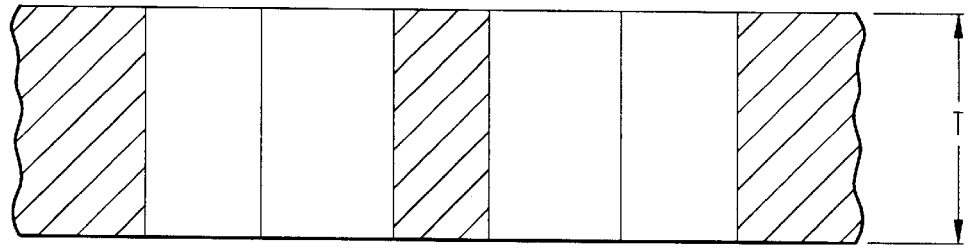
FIG. 14B depicts a cross sectional view of lower aperture 1214A of FIG. 14A along line B—B in accordance with an embodiment of the present invention.
Figure 15A:
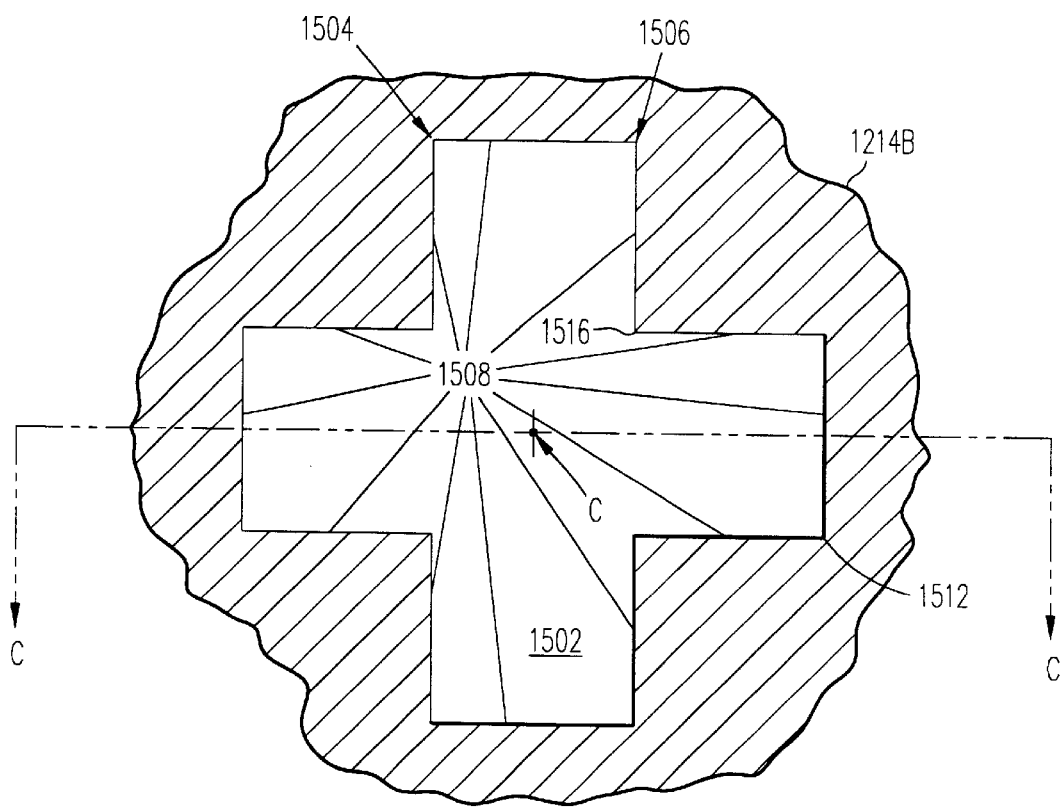
FIG. 15A depicts a plan view of a portion of lower aperture 1214B in accordance with an embodiment of the present invention.
Figure 15B:
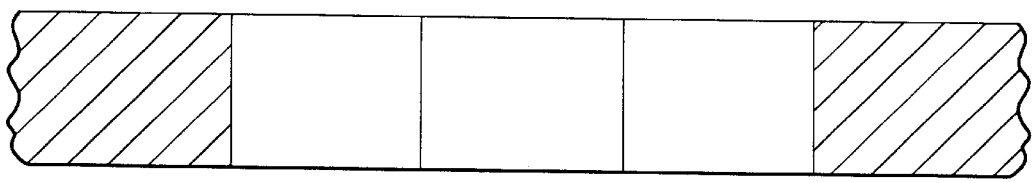
FIG. 15B depicts a cross sectional view of lower aperture 1214B of FIG. 15A along line C—C in accordance with an embodiment of the present invention.

In this embodiment, lower aperture 1214 is, e.g., either lower aperture 1214A (FIG. 14A) or lower aperture 1214B (FIG. 15A). FIG. 14A depicts a plan view of a portion of lower aperture 1214A. As depicted, lower aperture 1214A includes four openings 1402A–1402D. Each short side 1412 of each opening 1402A–1402D has a length A of approximately 3 μm. As depicted, the angle between each short side 1412 is 90°. The narrow distance X between each opening 302 is approximately 3 μm. FIG. 14B depicts a cross sectional view of lower aperture 1214A of FIG. 14A along line B—B. The thickness, T, of lower aperture 1214A is approximately 10 μm.

In this embodiment, lower aperture 1214A is constructed by depositing a low stress refractory metal such as a tungsten-titanium alloy on a silicon membrane and then patterning the four opening sections 1402A–1402D through both the metal and silicon membranes by use of a focused ion beam. In another embodiment, lower aperture 1214A is made of an approximately 10 μm thick foil of metal such as molybdenum, tungsten, or an alloy such as molybdenum-rhenium which may be heated by an electrical current to reduce contamination problems.

FIG. 15A depicts a top plan view of a portion of an alternative lower aperture 1214B. As shown, lower aperture 1214B includes a cross-shaped opening 1502. Each of the 12 sides 1508 of the cross-shaped opening is approximately 3 μm. As depicted, the angle between each side 1508 is 90°. FIG. 4B depicts a cross section of lower aperture 1214B of FIG. 4A along line C—C. The thickness of lower aperture 1214B is approximately 10 μm.

In this embodiment of the present invention, lower aperture 1214B is constructed by depositing a low stress refractory metal such as tungsten-titanium alloy on a silicon membrane and then patterning cross-shaped opening 1502 through both the metal and silicon membrane. In another embodiment, lower aperture 1214B is made of an approximately 10 μm thick foil of metal such as molybdenum, tungsten, or an alloy such as molybdenum-rhenium which may be heated by an electrical current to reduce contamination problems.

Upper aperture 1210, as depicted in FIG. 13A, and lower aperture 1214A of FIG. 14A or lower aperture 1214B of FIG. 15A are coaxially aligned along an axis descending from the tip of electron source 1204 through centerpoint C shown in FIGS. 13A, 14A, and 15A.

The L-shaped or cross-shaped openings in lower aperture 1214 allow electron beam 1222 to define an edge, an exterior corner, or an interior corner, anywhere within a flash field. Thus, edges and corners in a pattern can be placed in much smaller increments as required in semiconductor device fabrication.

Conventional lower deflector 1216 is positioned downstream from lower aperture 1214. The operation and a suitable structure of lower deflector 1216 is described in more detail later.

Figure 16:
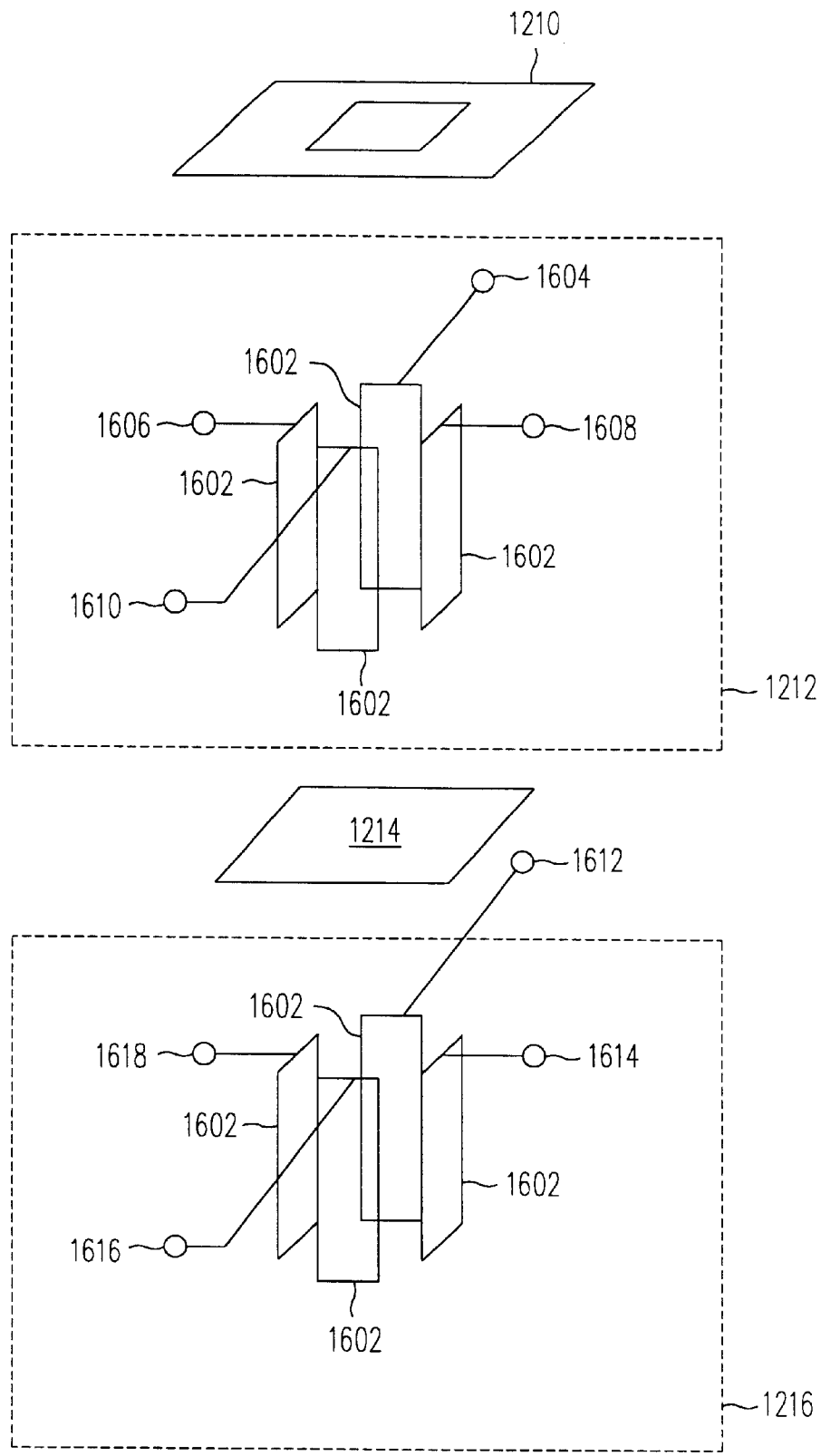
FIG. 16 depicts a suitable implementation and arrangement of conventional upper deflector 1212 and conventional lower deflector 1216 in accordance with an embodiment of the present invention.

FIG. 16 depicts a suitable implementation and arrangement of conventional upper deflector 1212 and conventional lower deflector 1216. Conventional upper deflector 1212 includes four metal plates 1602 arranged in a square shaped formation coupled to receive voltages at nodes 1606, 1608, 1604, and 1610. Similarly, conventional lower deflector 1216 includes four metal plates 1602 arranged in a square shaped formation coupled to receive voltages at nodes 1618, 1614, 1616, and 1612. In this embodiment, nodes of upper deflector 1212 and lower deflector 1216 are coupled to receive voltages from shaper/blanker driver 110. The operation of upper deflector 1212 and lower deflector 1216 are described in more detail later.

Conventional deflection coils 1218 are positioned downstream from the lower deflector 1216. Conventional deflection coils 1218 scan electron beam 1222 across the substrate 118 in a conventional raster scan. In this embodiment the length of the scan is up to 1 mm.

In accordance with the conventional raster scan, substrate 118 is positioned on a conventional stage which moves substrate 118 in a direction perpendicular to the direction of the raster scan and within the plane of substrate 118.

Conventional objective lens 1220 is positioned besides deflection coils 1218, that is, approximately within the same plane perpendicular to the direction of electron beam. Objective lens 1220 effectively controls the size of the electron beam shadow from lower aperture 1214 written onto substrate 118. An operation of objective lens 1220 is discussed in more detail below.

In this embodiment, shadow projection involves use of a small, high brightness TFE source to obtain a high current density in the shadow, e.g. up to 3000 amperes per square centimeter in the shaped beam as well as small crossover, i.e., the beam cross section is small at crossover point 1230 compared to the size of the shape shadow in plane 1806. The use of small openings in lower aperture 1214 allows for small deflection angles by upper deflector 1212, which in turn allows for relatively low deflection voltages. Low deflection voltages allow for a high rate of shaped beam generation. The present small shape size and small required deflection voltages also allow for short settling time for each shaped flash, e.g. less than 3 ns, which further facilitates a higher throughput than possible with conventional vector shaped beam apparatuses.

The shadow projection shaping also allows the use of a relatively short beam path which reduces electron—electron interactions that would otherwise cause a blurred image of the shaped beam on substrate 118.

The TFE electron source is less appropriate to use in a conventional vector shaped beam apparatus because it can not supply sufficient beam current for the larger shapes required.

Shaper/Blanker Driver 110

Shaper/blanker driver 110 controls the shape and duration of flash fields that electron beam column 112 writes onto substrate 118 by providing voltages to upper deflector 1212 and lower deflector 1216 of electron beam column 112.

Figure 17A:
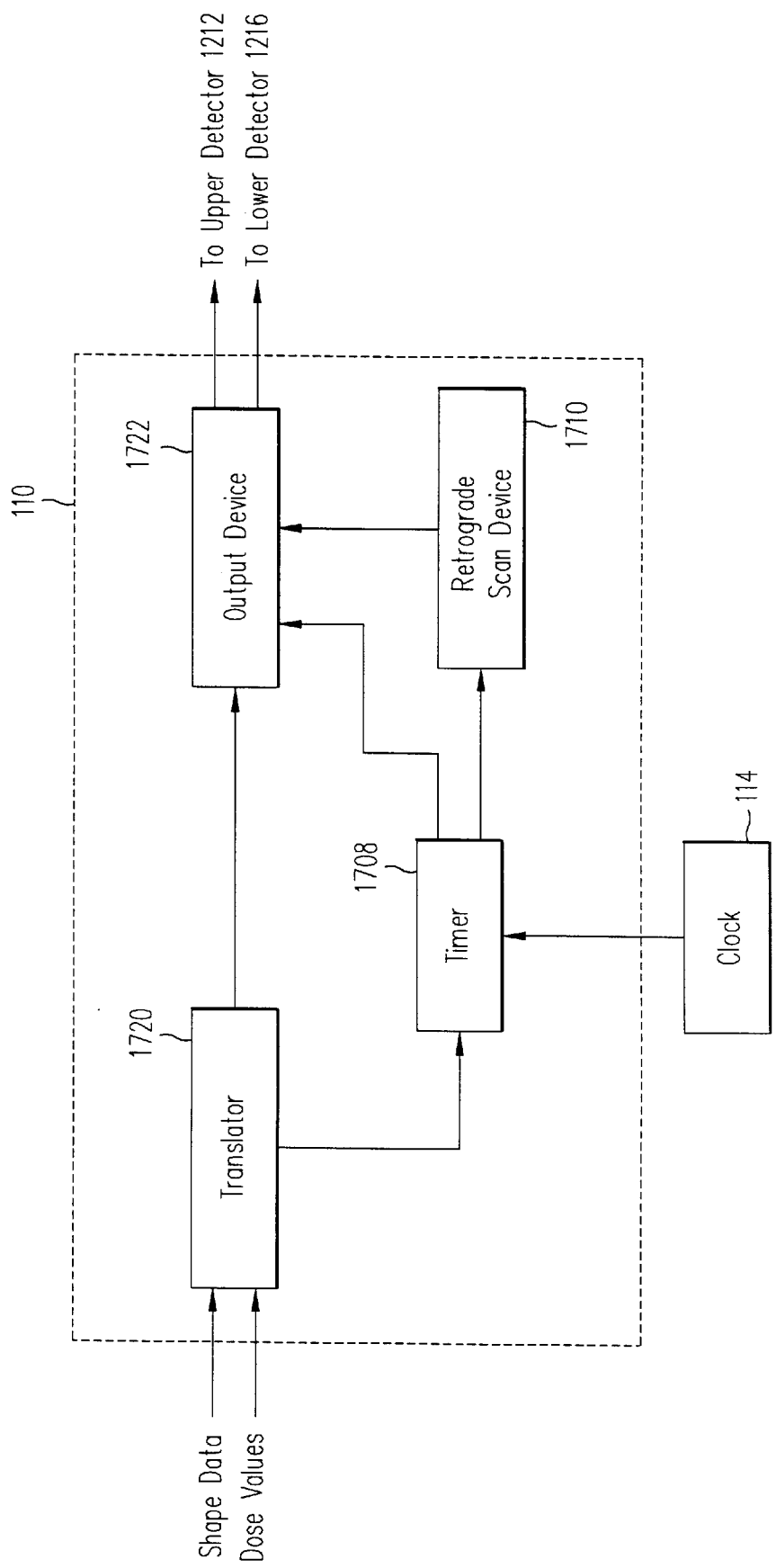
FIG. 17A depicts a block diagram of shaper/blanker driver 110 in accordance with an embodiment of the present invention.

FIG. 17A depicts a block diagram of shaper/blanker driver 110 that includes translator 1720, output device 1722, timer 1708, and retrograde scan device 1710. As discussed above, shaper/blanker driver 110 requests and receives flash data, i.e. shape data and corresponding dose values from respective flash converter 108 and dose value circuitry 106. Translator 1720 receives flash data and converts the shape data and corresponding dose values into respective voltage values and an exposure time. Translator 1720 provides exposure time to timer 1708 and provides voltage values to output device 1722. Output device 1722 converts voltage values into voltage signals and provides the voltage signals to deflectors of electron beam column 112. Timer 1708 controls the duration that output device 1722 outputs voltage signals according to the exposure time. Retrograde scan device 1710 applies a retrograde scan, discussed in more detail below, to the voltage signal applied to lower deflector 1216.

Figure 17B:
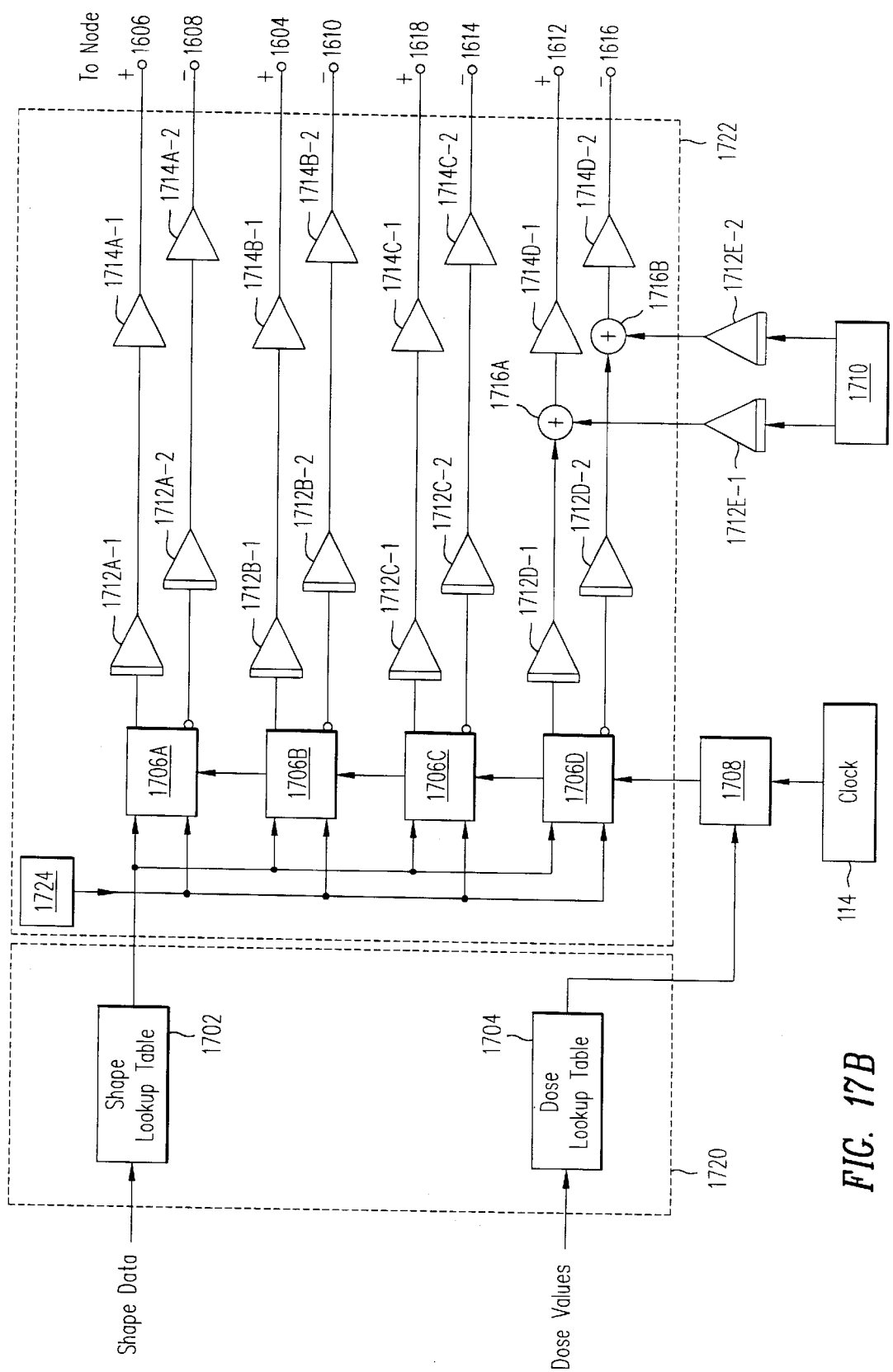
FIG. 17B depicts a more detailed block diagram of shaper/blanker driver 110 in accordance with an embodiment of the present invention.

FIG. 17B depicts a more detailed block diagram of shaper/blanker driver 110. In FIG. 17B, translator 1720 includes shape lookup table 1702 and dose lookup table 1704; output device 1722 includes multiplexers (MUXs) 1706A–1706D, digital to analog converters (DACs) 1712A-1, 1712A-2, 1712B-1, 1712B-2, 1712C-1, 1712C-2, 1712D-1, and 1712D-2, amplifiers 1714A-1, 1714A-2, 1714B-1, 1714B-2, 1714C-1, 1714C-2, 1714D-1, and 1714D-2, and blanking voltage register 1724.

For each input shape data, shape lookup table 1702 outputs four voltage values to MUXs 1706A–1706D. Two voltage values provided to MUXs 1706A and 1706B specify a 2 dimensional electric field deflection by upper deflector 1212 that effectively control a shaping of the electron beam cross section by controlling a location that electron beam intersects lower aperture 1214. Two voltage values provided to MUXs 1706C and 1706D specify a 2 dimensional electric field deflection by lower deflector 1216 that effectively offsets any deflection by upper deflector 1212 and positions the shaped electron beam on an intended portion of substrate 118.

In this embodiment, the location at which the electron beam intersects the lower aperture 1214 is adjustable by 4096 incremental distance units in either the horizontal or vertical direction within the plane of the lower aperture 1214. In this embodiment, each incremental unit is approximately 12/4096 μm. The fine incremental positioning allows for offsetting fine errors due for example to variations in an opening defined by lower aperture 1214 over time. In one embodiment, each voltage value is a 12 bit value.

An exemplary implementation of shape lookup table 1702 includes conventional static random access memory. In this embodiment, shape lookup table 1702 is readily programmable. This is necessary because suitable shape lookup table entries, i.e. voltage values to shape the electron beam cross section as desired, may vary. The voltage values in shape lookup table 1702 may need to be changed over time for an electron beam column because the characteristics of electron beam column 112 change over time. For example, the openings defined by the apertures may change over time due to wear. Also, the voltage values for a specific flash field may vary between various electron beam columns.

An exemplary implementation of dose lookup table 1704 includes a conventional static random access memory. Dose lookup table 1704 outputs an exposure time associated with dose values to the timer 1708. As stated above, an exposure time specifies a time that the deflectors of electron beam column 112 deflect its electron beam. In this embodiment the exposure time value is a 9 bit value and can specify at most 10 ns. In this embodiment, dose lookup table 1704 is readily programmable for similar reasons as discussed with respect to shape lookup table 1702.

Timer 1708 receives exposure time values from dose lookup table 1704 and further receives the clock signal of system clock 114 of FIG. 1. Timer 1708 outputs a binary output signal to toggle outputs of MUXs 1706A–1706D. Timer 1708 outputs a positive binary signal to MUXs 1706A–1706D for the number of clock cycles specified by each exposure time value and a negative binary signal to MUXs 1706A–1706D otherwise. A suitable implementation for timer 1708 is emitter coupled logic circuit.

In this embodiment, timer 1708 further requests flash converter 108 and dose value circuitry 106 to begin providing flash data, i.e. shape data and dose values, to shaper/blanker driver 110. In this embodiment, timer 1708 provides a first request to begin the flow of a column of flash data from buffer 1204 and repeats such request after timer receives a column of flash data. In this embodiment a column corresponds to 4096 flash data, and timer 1708 provides a request every approximately 40.96 ms.

Further operation of timer 1708 is described with respect to position adjuster 116.

MUXs 1706A–1706D are each a conventional multiplexer that receives multiple input signal and provides a single output signal in response to a control signal. A first input signal to MUXs 1706A–1706D is the set of four voltage values from the shape lookup table 1702. A second input signal is a set of four voltage values that correspond to a beam blanking position from blanking voltage register 1724. The binary output signal of timer 1708 controls the output signal of MUXs 1706A–1706D. Thus in this embodiment, during a 10 ns flash cycle, for a time specified by exposure time, MUXs 1706A–1706D output the four voltage values from shape lookup table 1702 and during the remaining time the MUXs output voltage values that blank the electron beam. In most cases the voltage values that blank the electron beam are zero although they may be adjusted to minimize dose error in a blanking operation. As depicted in FIG. 17B, MUXs 1706A–1706D provide their outputs to respective "shaper" DACs 1712A-1, 1712A-2, 1712B-1, 1712B-2, 1712C-1, 1712C-2, 1712D-1, and 1712D-2.

Conventional DACs 1712A-1, 1712A-2, 1712B-1, 1712B-2, 1712C-1, 1712C-2, 1712D-1, and 1712D-2 convert the voltage values into analog voltage signals. In this embodiment, these DACs essentially multiply each 12 bit binary voltage value by a conversion ratio of $0.5\ V/2^{12}$. In this embodiment, the maximum voltage output of a DAC is approximately 0.5 V peak-to-peak. DACs 1712A-1, 1712A-2, 1712B-1, and 1712B-2 provide analog voltages to respective conventional amplifiers 1714A-1, 1714A-2, 1714B-1, and 1714B-2, which provide voltages to upper deflector 1212. DACs 1712C-1 and 1712C-2 provide analog voltages to respective conventional amplifiers 1714C-1 and 1714C-2 which provide voltages to lower deflector 1216. DACs 1712D-1 and 1712D-2 provide analog voltages to respective conventional voltage adders 1716A and 1716B, which provide voltages, as modified by signals from retrograde scan device 1710 described in more detail below, to lower deflector 1216.

Retrograde scan device 1710 adjusts voltages provided to lower deflector 1216 to offset the movement of the position of the beam on substrate 118 during the raster scan discussed above (so called "retrograde scan"). The retrograde scan prevents the electron beam column 112 from spreading a flash field beyond its intended area. In this embodiment, retrograde scan device 1710 outputs binary values that increase or decrease in value in a stair case fashion to conventional DACs 1712E-1 and 1712E-2. In this embodiment, each of the staircase corresponds to approximately 200/8 nm of offset to the position of a flash field on the substrate. In one embodiment, retrograde scan device 1710 provides eight steps per flash cycle, i.e. 10 ns. Whether binary values increase or decrease depends on the direction of the raster scan sweep. The staircase signal is subsequently filtered (not depicted) to remove the third harmonic thus creating an approximately saw-tooth waveform with a same period as the staircase signal. Retrograde scan device 1710 adds values for a raster scan sweep up a column, i.e. 4096 flash fields arranged in a line, and subtracts values going down a column. DACs 1712E-1 and 1712E-2 in turn output analog voltage representations of the binary values to respective voltage adders 1716A and 1716B. Voltage adders 1716A and 1716B add voltages provided by DACs 1712D-1, 1712D-2, 1712E-1, and 1712E-2 and output the sum of the voltages to respective conventional amplifiers 1714D-1 and 1714D-2.

In this embodiment, conventional amplifiers 1714A-1, 1714A-2, 1714B-1, 1714B-2, 1714C-1, 1714C-2, 1714D-1, 1714D-2, 1712E-1, and 1712E-2 output signals that are each 10 times the magnitude of the input signals. Amplifiers 1714A-1, 1714A-2, 1714B-1, and 1714B-2 output voltages to respective nodes 1606, 1608, 1604, and 1610 of upper deflector 1212. Amplifiers 1714C-1, 1714C-2, 1714D-1, and 1714D-2 output voltages to respective nodes 1618, 1614, 1612, and 1616 of lower deflector 1216.

In the prior art, retrograde scan circuitry is separate from circuitry that generates voltages to the deflectors. Advantageously, in this embodiment, by combining the retrograde scan capability into the shaper/blanker driver, the length of electron beam column 118 can be shorter than that of a prior art electron beam column. A shorter electron beam column allows use of less current to generate a flash field, which allows for faster generation of flash fields.

Position Adjuster 116

In the conventional raster scan described above, substrate 118 is positioned on a conventional stage which moves substrate 118 in a direction perpendicular to the direction of the raster scan and within a plane. A conventional position adjuster circuit 116 compensates for the horizontal movement of substrate 118 on the conventional stage. Position adjuster circuit deflects the direction of the incident electron beam by using an electric field so that electron beam column 112 writes a flash field in a proper location. The adjustment is similar to the retrograde scan described above.

Timer 1708 of shaper/blanker driver 110 communicates the approximate movement of substrate 118 to position adjuster 116. Timer 1708 provides a signal indicating when electron beam column 112 has completed writing a column of flash fields. In one embodiment, the substrate moves horizontally approximately 200 nm every 40.96 ms, i.e. a column width.

An Example Operation of Electron Beam Column 112

Figure 18:
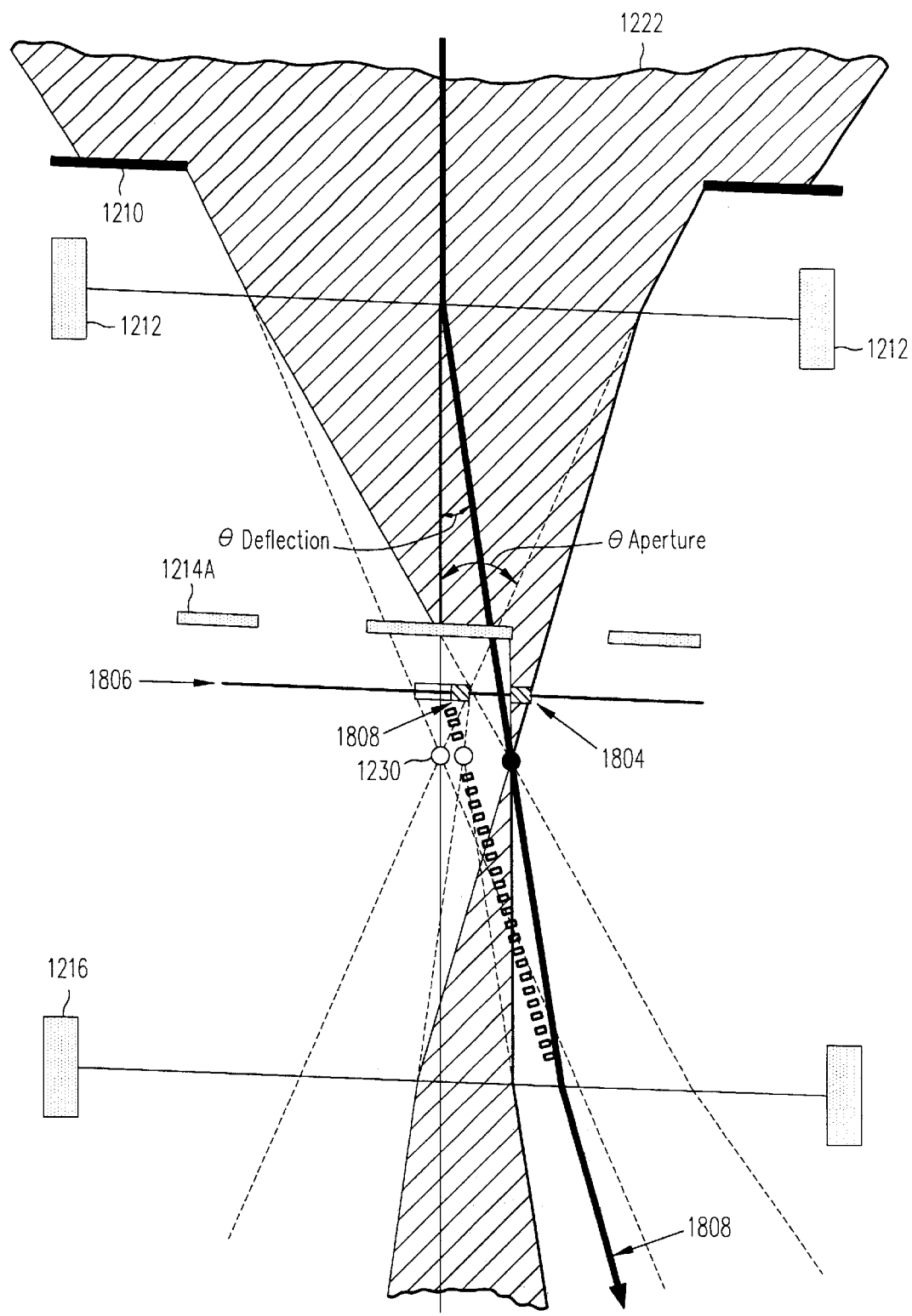
FIG. 18 depicts schematically an example path of electron beam 1222 through upper aperture 1210 and lower aperture 1214A in accordance with an embodiment of the present invention.

The following is an example of operation of electron beam column 112 during a single flash cycle. FIG. 18 depicts an example of a shaping action as electron beam 1222 traverses upper aperture 1210 and lower aperture 1214. TFE electron source 1204 emits electron beam 1222 (not depicted). Transfer lens 1206 (not depicted) focuses electron beam 1222 at crossover point 1230, approximately 1 mm downstream from lower aperture 1214. When upper aperture 1210 is illuminated by TFE electron source 1204, a well resolved shadow of square opening 1302 that corresponds to the cross section of the electron beam 1222 is projected downstream from upper aperture 1210. Initially, there is no voltage on upper deflector 1212 SO electron beam 1222 intersects a solid portion of lower aperture (so called "beam blanking operation").

Subsequently flash converter 108 and dose value circuitry 106 provide a flash data, i.e. shape data and dose values, to shaper/blanker driver 110 which applies resultant voltages to upper deflector 1212 and lower deflector 1216. Upper deflector 1212 then changes the direction of electron beam 1222 to impinge on the opening defined in lower aperture 1214 to shape the electron beam cross section as specified by the shape data. A shadow of the shaped electron beam cross section appears at site 1804 in plane 1806, downstream from lower aperture 1214. Plane 1806 is parallel to the plane of lower aperture 1214 and approximately 0.6 mm downstream from lower aperture 1214.

Lower deflector 1216 applies an electric field which changes the direction of the shaped electron beam 1222 such that the shadow at site 1804 appears to be positioned at site 1808 as viewed from substrate 118 (not depicted). Thus the lower deflector 1216 allows shaping without substantial shift of the beam's position on the substrate 118. As stated earlier, lower deflector 1216 also applies an electric field that provides a retrograde scan described above. Objective lens 1220 (not depicted) focuses on substrate 118 the shadow of the shaped electron beam 1222 at site 1808. The duration of exposure of the flash field is specified by timer 1708 of shaper/blanker driver 110. When the exposure of the flash field is complete, the beam returns to the blanked position, e.g. in the center of the lower aperture 1214A.

It is noted that in this example, the angle by which the upper deflector changes the direction of the beam's central axis 1808 ($\theta_{deflection}$) is much smaller than the divergence angle ($\theta_{aperture}$) of the electron beam.

The following describes an example of shaping the cross section of electron beam 1222 by lower aperture 1214A.

FIGS. 19A and 19B each depict a plan view of openings 1402A–1402D of lower aperture 1214A and a blanking position 1904 located in a solid portion of lower aperture 1214A. FIGS. 19A and 19B each further depict electron beam shapes (in cross section) 1908 and 1910 generated using respective openings 1402A and 1402C of lower aperture 1214A. Electron beam 1222 first intersects blanking position 1904 (the "beam blanking operation"). To generate shape 1908, which may correspond for example to shape class 5 and coordinates of (20, 25), upper deflector 1212 directs square shaped electron beam 1222 from blanking position 1904 to impinge on area 1902 so that the cross section of the portion of electron beam 1222 which traverses the lower aperture 1214B matches shape 1908. To generate shape 1910, which may correspond for example to shape class 10 and coordinates of (15, 25), upper deflector 1212 directs square shaped electron beam 1222 from blanking position 1904 to impinge on area 1906 so that the cross section of electron beam 1222 that traverses lower aperture 1214B matches shape 1910.

FIGS. 20A and 20B each depict an example of a shaping of the cross section of electron beam 1222 as shapes 1908 and 1910 using opening 1502 of lower aperture 1214B. To generate shape 1908, upper deflector 1212 directs square shaped electron beam 1222 to impinge area 2002 so that a portion of the cross section of electron beam 1222 which traverses lower aperture 1214B matches shape 1908. To generate shape 1910, upper deflector 1212 directs square shaped electron beam 1222 to impinge area 2004 so that a portion of the cross section of electron beam 1222 which traverses the lower aperture 1214B matches shape 1910.

As stated above, electron beam column 112 performs the beam blanking operation by directing electron beam 122 onto blanking position 1904 of lower aperture 1214A. In this embodiment, when shaper/blanker driver 110 applies approximately no voltage to nodes 1606, 1608, 1604, and 1610 of upper deflector 1212, electron beam 1222 is incident on blanking position 1904. Thus beam blanking occurs without electron beam 1222 traversing an open area of lower aperture 1214A. However, for lower aperture 1214B, electron beam 1222 traverses opening 1502 when shaper/blanker driver 110 applies no voltage to upper deflector 1212. In order to blank electron beam 122, upper deflector 1212 deflects the path of electron beam 1222 so that a solid portion of lower aperture 1214B (the specific blocking portion is not depicted) blocks the path of electron beam 1222. However, electron beam 1222 must traverse opening 1502 in lower aperture 1214B before blockage by a solid portion of lower aperture 1214B. The traversal of an opening in beam blanking introduces undesirable dose error. Thus a lower dose error is associated with lower aperture 1214A than lower aperture 1214B. Lower aperture 1214A also allows for faster beam blanking than lower aperture 1214B because there is no delay incurred from altering the path of electron beam 1222 to cause beam blanking.

It is desirable that different portions of lower aperture 1214 are used to shape electron beam 1222, in order to distribute electron beam heating of the aperture. For example exposure of a full, square shaped flash field is very common. Referring to FIG. 14A, to distribute heating of lower aperture 1214A when generating a full flash field, a square shaped cross section of electron beam 1222 is shaped using e.g. corners 1404, 1406, 1408, or 1410. Similarly, referring to FIG. 15A, when generating a full flash field, a cross section of electron beam 1222 is shaped using e.g. corners 1504, 1506, or 1512. A similar heat distribution scheme can be applied to other electron beam cross section shapes.

The above-described embodiments are illustrative and not limiting. It will thus be obvious to those skilled in the art that various changes and modifications may be made without departing from this invention in its broader aspects. For example, the distances between and dimensions of the components within electron beam column 112 such as upper aperture 1210, lower aperture 1214A, or lower aperture 1214B can be optimized for larger or smaller minimum device features. The openings defined by upper aperture 1210, lower aperture 1214A, and lower aperture 1214B can be altered. Flash fields can be other than 2 pixels by 2 pixels. The plates of lower deflector 1216 and upper deflector 1212 may be thin metal rods. Therefore, the appended claims encompass all such changes and modifications as fall within the scope of this invention.

Appendices A and B, which are part of the present disclosure, include an article and a computer program listing, which are copyrighted. The copyright owner, ETEC Systems Inc., has no objection to the facsimile reproduction by anyone of the patent document or the present disclosure, as it appears in the Patent and Trademark Office patent files or records, but otherwise reserves all copyrights whatsoever.

What is claimed is:

1. A converter which generates signals to control a shaping of an energy beam that strikes a substrate comprising:
    a translator which translates received input shape data into shape and position signals, and translates input duration information into a duration signal, wherein said shape signals control the shaping of said beam, said position signal specifies a position of said beam on said substrate, and said duration signal specifies a duration of exposure of said beam on said substrate;
    a retrograde scan circuit that outputs a retrograde signal;
    an output circuit coupled to receive said shape signals, said retrograde signal, and said position signal, wherein said output circuit adjusts said position signal according to said retrograde signal and outputs said shape and adjusted position signals; and
    a timer circuit coupled to receive said duration signal from said translator circuit, wherein said timer circuit controls said duration signal that said output circuit outputs said shape signal.

2. The converter of claim 1 wherein said translator further comprises:
    a first lookup table storing entries of said shape and position signals associated with said shape data; and
    a second lookup table storing entries of said duration signals associated with said duration information.

3. The converter of claim 1 wherein said output circuit further comprises:
    a blanking signal generator that generates beam blanking signals; and
    a multiplexer coupled to receive said shape signals from said translator and said beam blanking signals, wherein said timer circuit selects an output of said multiplexer from said shape signals and said beam blanking signals based on said duration signal.

4. The converter of claim 3 wherein said output circuit further comprises:
    an adder that adds said retrograde signal to said position signal.

5. A method of generating signals that control the shape of an energy beam that strikes a substrate comprising the acts of:
    receiving data defining the shape of said beam;
    translating said shape data into shape and position signals;
    translating duration information pertaining to said beam into a duration signal, wherein said shape signals control the shape of said beam, said position signal specifies a position of said beam on said substrate being written by said beam, and said duration signal specifies a duration of exposure of said beam on said substrate;
    providing a retrograde signal with said position signal that offsets a raster scan movement of said beam; and
    outputting said shape signals based on said duration signal.

6. The method of claim 5 wherein said translating said shape data into shape and position signals further comprises the act of:
    looking up shape and position signals that are associated with said shape data from a first table.

7. The method of claim 5 wherein said translating a duration information into a duration signal further comprises the act of:
    looking up a duration signal associated with said duration information from a second table.

8. The method of claim 5 further comprising the acts of:
    generating beam blanking signals; and
    outputting said beam blanking signals or said shape signals based on said duration signal.

9. The method of claim 8 further comprising the acts of:
    converting said shape signals or said beam blanking signals into a first signal; and
    converting said position signal into a second signal.

10. The method of claim 9 further comprising the acts of:
    generating a third signal from said retrograde signal; and
    combining said third signal with said second signal.

* * * * *